United States Patent
Schultz

(10) Patent No.: US 8,624,320 B2
(45) Date of Patent: Jan. 7, 2014

(54) PROCESS FOR FORMING FINS FOR A FINFET DEVICE

(75) Inventor: Richard T. Schultz, Fort Collins, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 97 days.

(21) Appl. No.: 12/848,744

(22) Filed: Aug. 2, 2010

(65) Prior Publication Data

US 2012/0025316 A1 Feb. 2, 2012

(51) Int. Cl.
*H01L 29/786* (2006.01)

(52) U.S. Cl.
USPC ........... 257/354; 257/353; 257/618; 257/623; 257/E27.026

(58) Field of Classification Search
USPC ................. 257/288, 327, 353, 354, 618, 623, 257/E27.026
See application file for complete search history.

(56) References Cited

U.S. PATENT DOCUMENTS

| 5,391,895 | A * | 2/1995 | Dreifus ........................... 257/77 |
| 7,402,856 | B2 * | 7/2008 | Brask et al. ................... 257/288 |
| 7,560,759 | B2 * | 7/2009 | Kang et al. .................... 257/288 |
| 2006/0231874 | A1 * | 10/2006 | Popp et al. .................... 257/288 |
| 2009/0273011 | A1 * | 11/2009 | Bjoerk et al. ................. 257/288 |

* cited by examiner

*Primary Examiner* — Eduardo A Rodela
(74) *Attorney, Agent, or Firm* — Faegre Baker Daniels LLP

(57) ABSTRACT

An integrated fin-based field effect transistor (FinFET) and method of fabricating such devices on a bulk wafer with EPI-defined fin heights over shallow trench isolation (STI) regions. The FinFET channels overlie the STI regions within the semiconductor bulk, while the fins extend beyond the STI regions into the source and drain regions which are implanted within the semiconductor bulk. With bulk source and drain regions, reduced external FinFET resistance is provided, and with the fins extending into the bulk source and drain regions, improved thermal properties is provided over conventional silicon on insulator (SOI) devices.

6 Claims, 35 Drawing Sheets

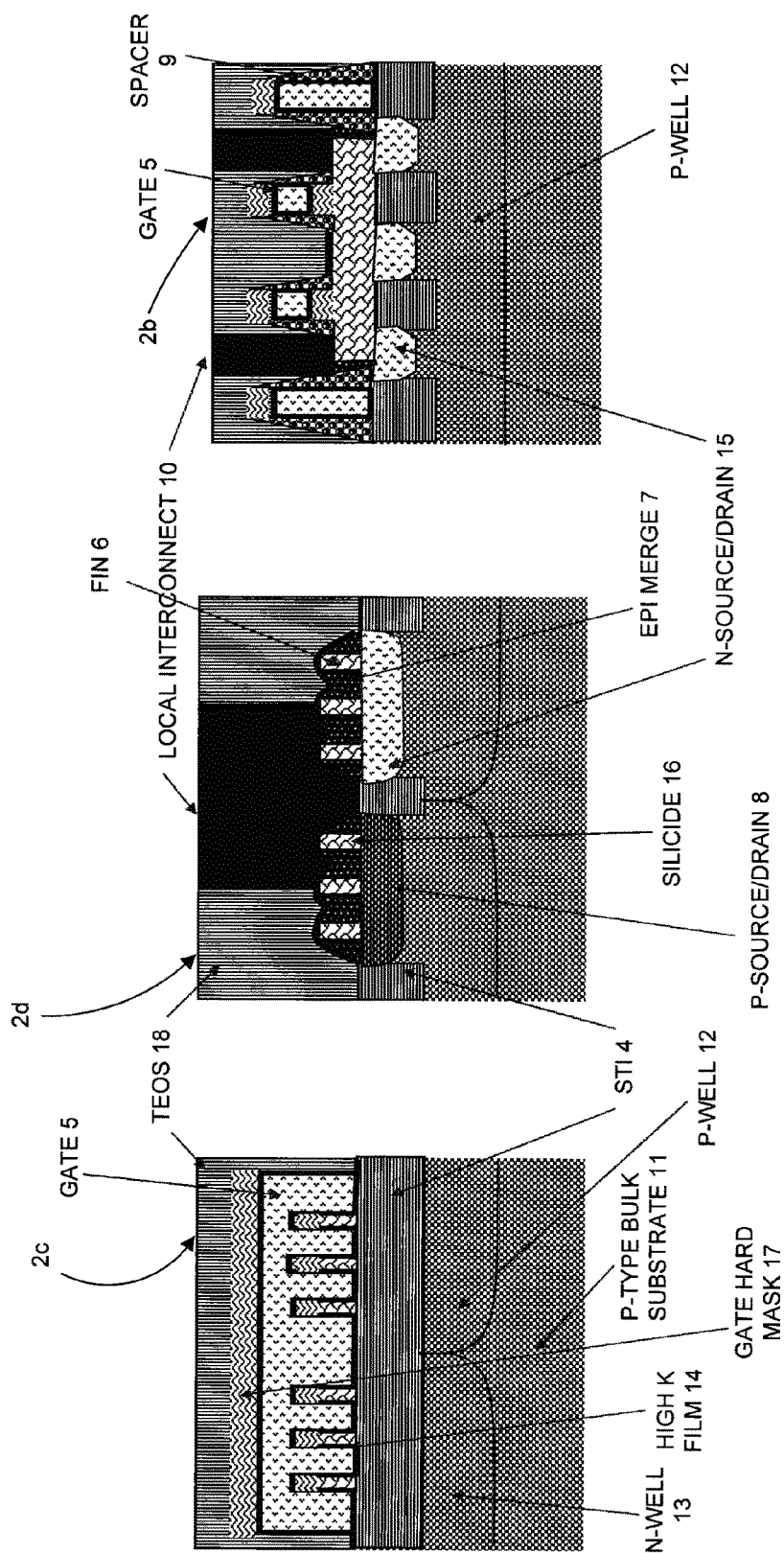

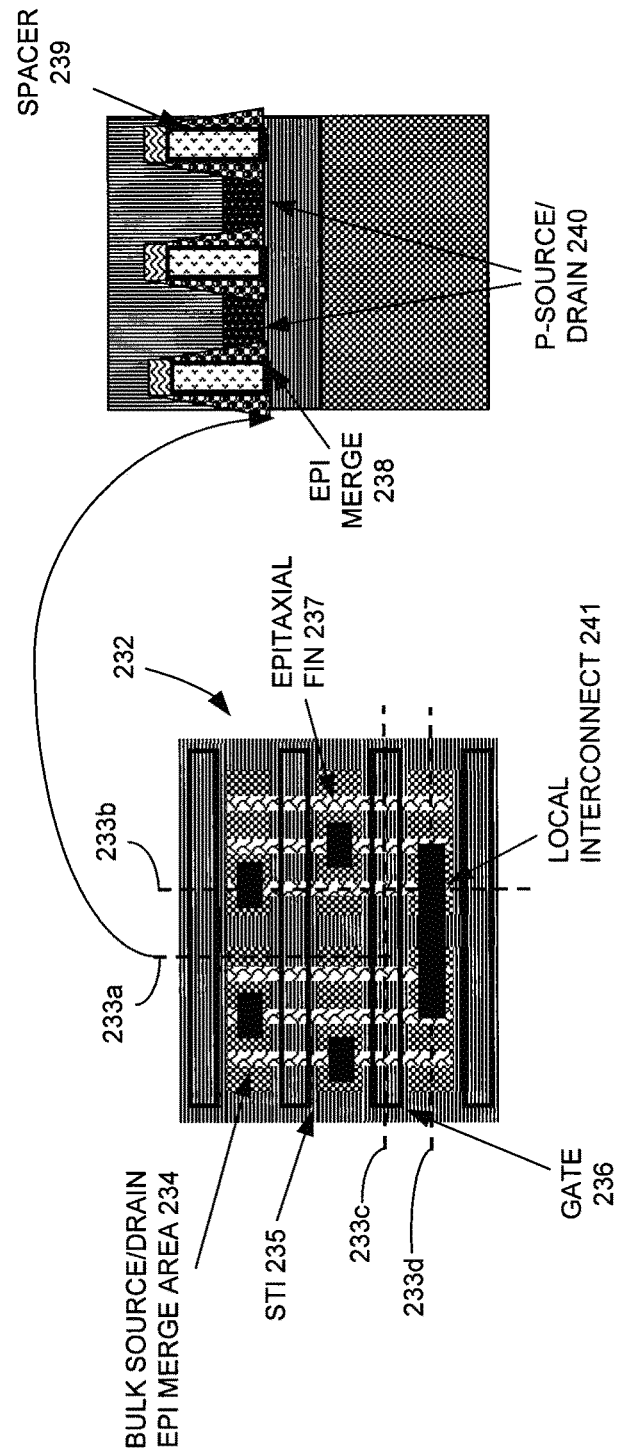

PROCESS FOR FORMING FINS FOR A FINFET DEVICE

FIELD OF THE DISCLOSURE

The present disclosure relates to multiple gate field effect transistors (FETs), such as metal oxide semiconductor field effect transistors (MOSFETs), and in particular, to Fin-based field effect transistors, also known as FinFETs.

BACKGROUND OF THE DISCLOSURE

Perhaps the single most important device in modern electronic systems is the MOSFET. Such devices are used not only as transistors but also as passive devices, such as resistances and capacitances. The ability to scale such devices down to ever smaller dimensions has allowed electronic systems to become smaller to the point of enabling many hand-held and pocket-size systems. However, at the current pace of device scaling, it is predicted that planar transistors will soon reach their limits, in terms of minimize size. Further, as these devices get smaller, they increasingly suffer from undesirable short channel effects, such as off-state leakage current, which increases power consumption by the device.

As a result, multiple-gate MOSFETs have become of increased interest, based on their use of multiple gates on multiple surfaces, thereby more effectively suppressing off-state leakage currents. Further, these multiple gates allow enhanced current in the on-state, i.e., the drive current. Such advantages result in lower power consumption and enhanced device performance. Moreover, such non-planar devices are smaller than conventional planar transistors, thereby enabling even higher circuit densities and, therefore, smaller system sizes.

One particular multiple-gate MOSFET that has been developed is a FinFET, in which the conducting channel is disposed around a thin silicon "Fin", which serves as the body of the device. The dimensions of the Fin establish the effective channel length for the transistor.

Conventional FinFETs are fabricated using silicon over insulator (SOI) techniques. However, such devices often have poor thermal properties, e.g., poor heat dissipation, as well as relatively significant external resistances. Accordingly, an improved FinFET would be desirable.

BRIEF DESCRIPTION OF THE DRAWINGS

FIG. 1 is a plan view of an integrated FinFET in accordance with an exemplary embodiment.

FIGS. 2-5 are cross-sectional views of the FinFET of FIG. 1 along lines 2a-2d, respectively.

FIG. 66 is a plan view of a conventional FinFET.

FIGS. 67-70 are cross-sectional views of the device of FIG. 66 along lines 233a-233d, respectively.

DETAILED DESCRIPTION OF PREFERRED EMBODIMENTS

Figures 1, 2:
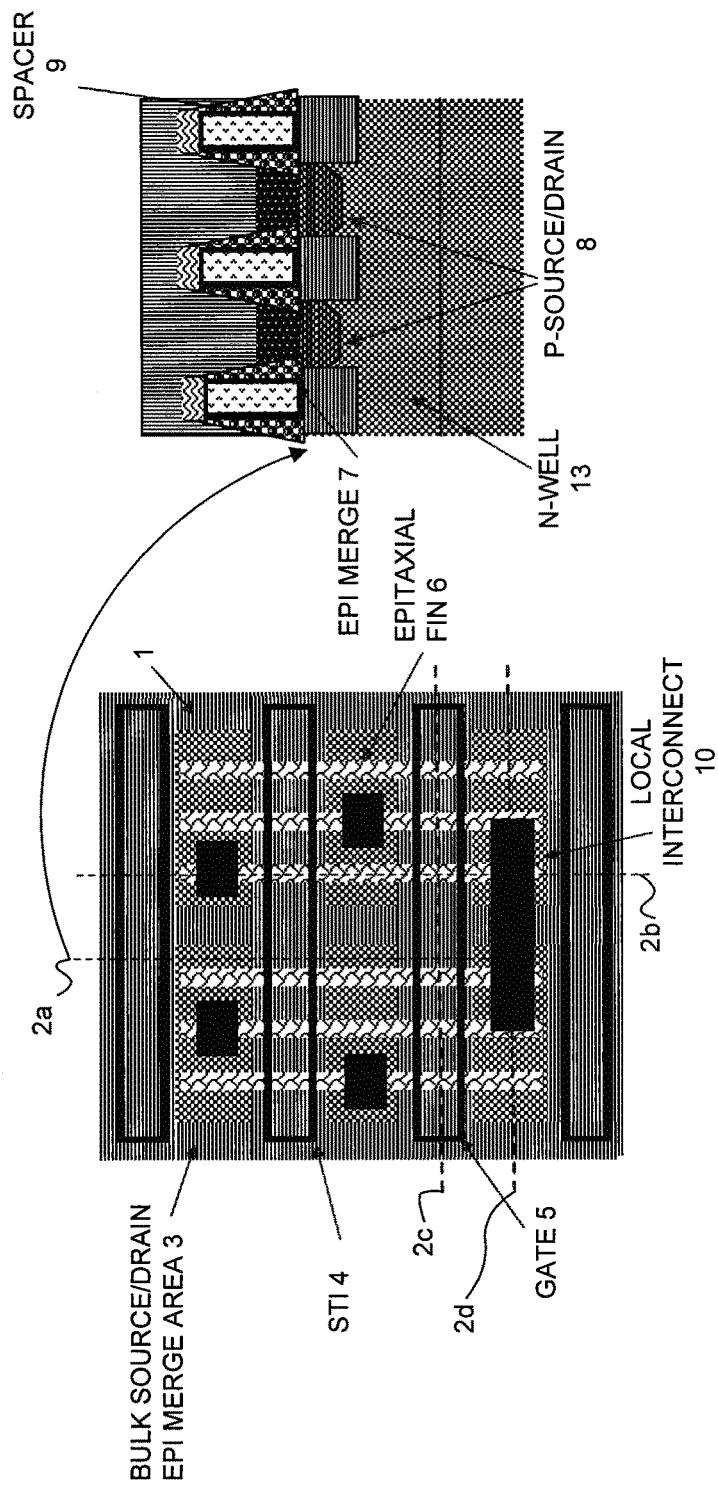

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

An integrated fin-based field effect transistor (FinFET) and method of fabricating such devices on a bulk wafer with EPI-defined fin heights over shallow trench isolation (STI) regions are provided. The FinFET channels overlie the STI regions within the semiconductor bulk, while the fins extend beyond the STI regions into the source and drain regions which are implanted within the semiconductor bulk. With bulk source and drain regions, reduced external FinFET resistance is provided, and with the fins extending into the bulk source and drain regions, improved thermal properties is provided over conventional silicon on insulator (SOI) devices.

Advantageously, such a device minimizes external resistances by allowing the source and drain regions to be located in the bulk and closer to the channel. Further advantageously, an undoped channel epitaxial (EPI) based Fin is disposed over shallow trench isolation (STI), such that the EPI layer allows for better control of the Fin heights, with less variability, and more consistent Fins, e.g., no undercutting. Further advantageously, such a device allows for performance enhancement from the introduction of additional strain in the STI layer, as well as from the bulk source and drain regions. Further advantageously, heat dissipation is increased with the Fins connected to the source and drain regions with the bulk substrate.

In accordance with an exemplary embodiment, the FinFET channel will be completely over STI while the Fins extend beyond the STI into the bulk source and drain regions. The source and drain regions can be formed using conventional source and drain implants and wells below. Extension of the Fins into the bulk source and drain regions allow for improved thermal properties similar to those using conventional bulk techniques, as opposed to SOI. With the FinFET channel over the STI, the Fin height in the channel region is determined by the deposited EPI layer over the STI. The bulk source and drain regions help reduce external resistances. The device architecture includes flexibility with respect to strain enhancement techniques in the STI layer below the channel and gate and also from the bulk source and drain regions.

Referring to FIGS. 1 and 2-5, a FinFET 1 in accordance with an exemplary embodiment includes a bulk source and drain and EPI merge area 3, shallow trench isolation 4, gate electrodes 5, epitaxial Fins 6, EPI merges 7, P-type source and drain regions 8, spacers 9, local interconnects 10, P-type bulk substrate 11, P-well 12, N-well 13, high K film 14, N-source and drain regions 15, silicide 16, gate hard mask 17 and TEOS regions 18, substantially as shown. As discussed in more detail below, the shallow trench isolation (STI) regions are disposed within the bulk, with the source and drain regions disposed between neighboring STI regions. The Fins are disposed substantially normal to the STI regions, with parts of which disposed over STI regions and other parts of which disposed within the source and drain regions. Each of the gate electrodes is disposed over portions of each of the Fins and laterally away from the source and drain regions, i.e., not above the source and drain regions.

The processing steps as discussed below are conventional in nature and, therefore, well known to one of ordinary skill in the art. The order in which the processing steps are discussed is not intended to necessarily be the only order in which such processing steps may be practiced, but rather are shown by way of example.

Figure 6:
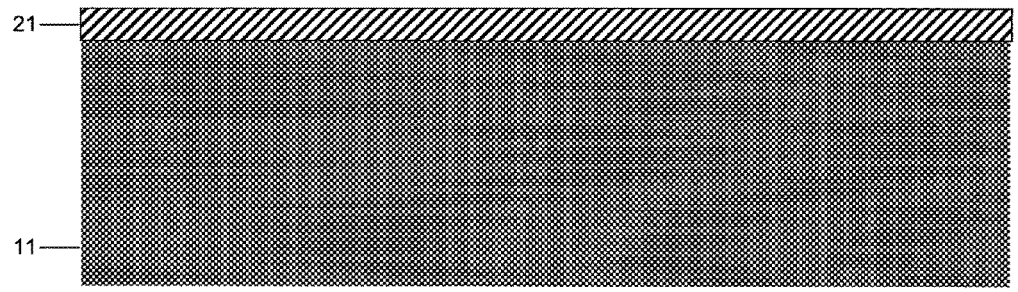
FIGS. 6-8 are cross-sectional views during fabrication of the shallow trench isolation (STI) of the device of FIG. 1.
Figure 7:
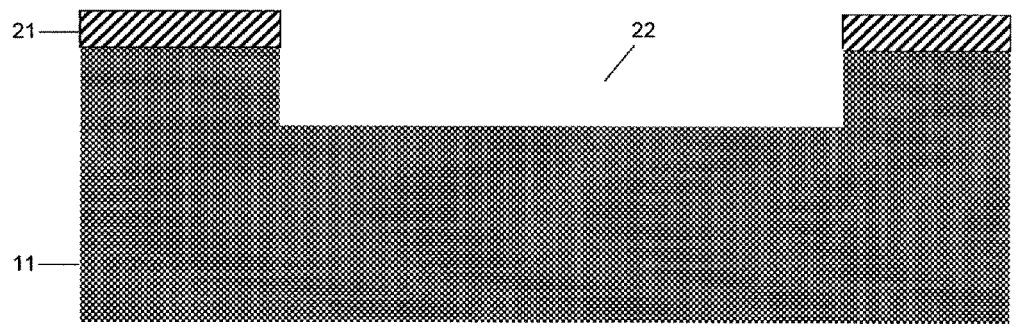
Figure 8:
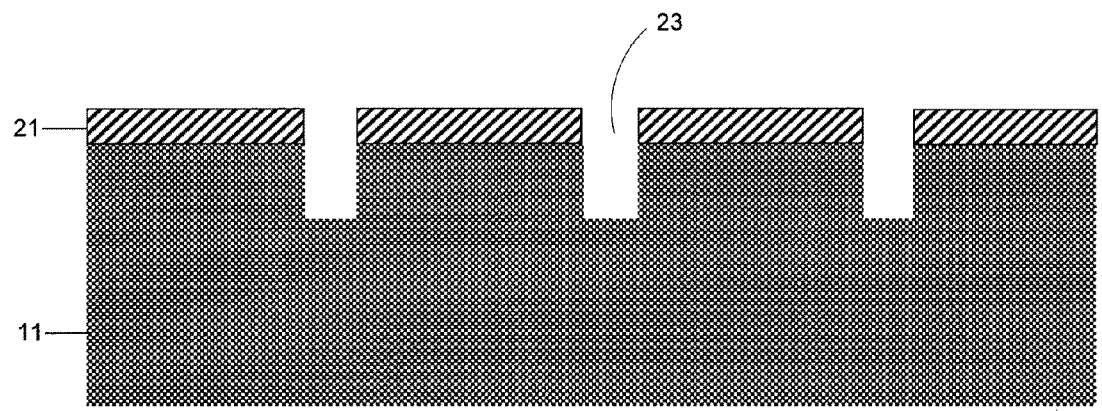
Figure 9:
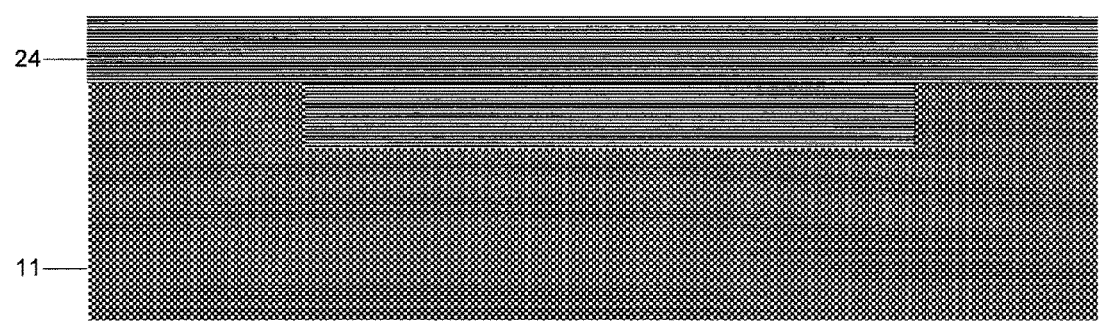
FIGS. 9-12 are cross-sectional views of the fabrication of the shallow trench isolation using TEOS oxide.
Figure 10:
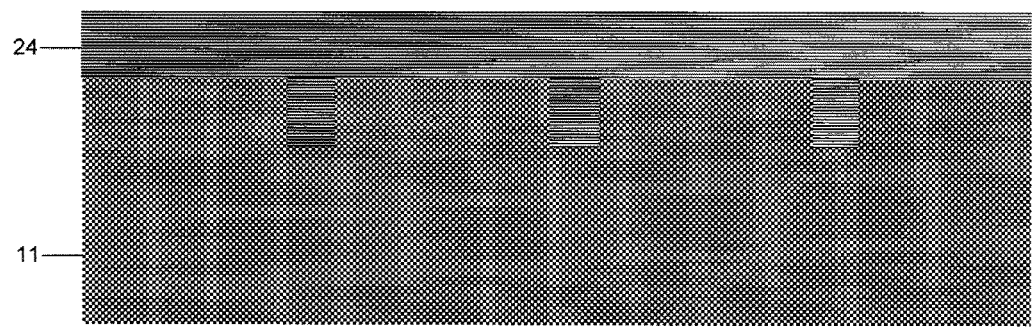
Figure 11:
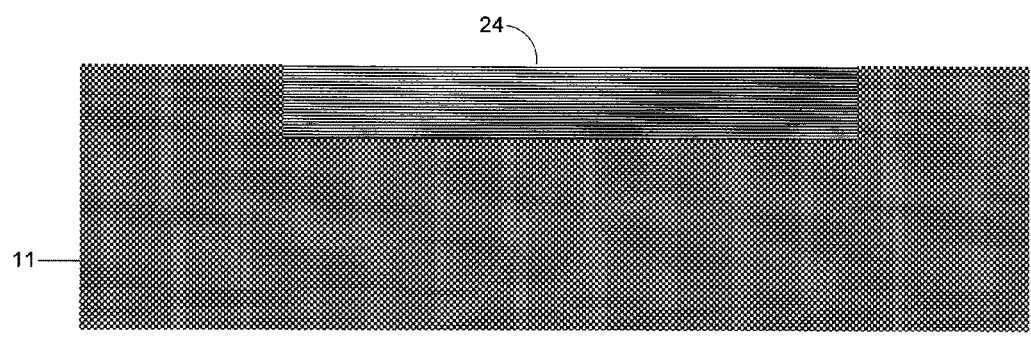
Figure 12:
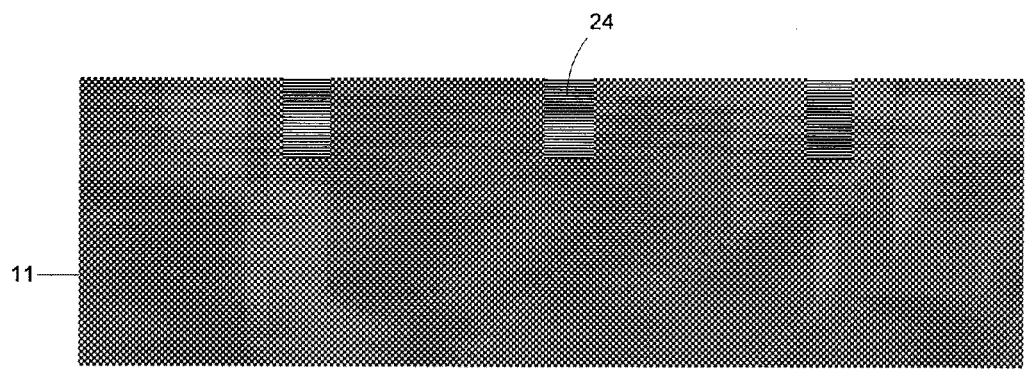

Referring to FIGS. 6-8, as seen along lines 2c and 2d (FIG. 1), a photo resist 21 is deposited over the bulk 11 and etched away to produce the STI trenches 22, 23.

Referring to FIGS. 9-12, as seen alternately along lines 2c and 2d, respectively, TEOS oxide 24 is deposited and then removed by chemical-mechanical polishing (CMP), thereby filling in the STI trenches.

Figure 13:
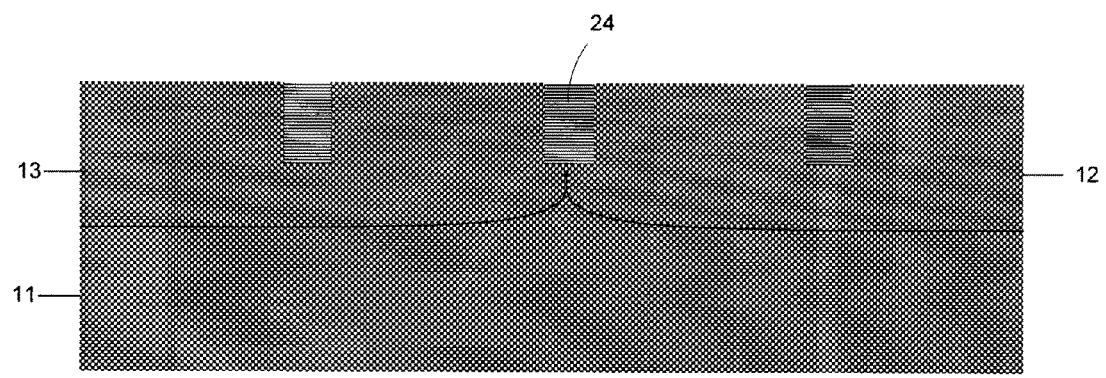
FIG. 13 is a cross-sectional view illustrating the implantation of the N-well and P-well.

Referring to FIG. 13, the P-well 12 and N-13 are implanted.

Figure 14:
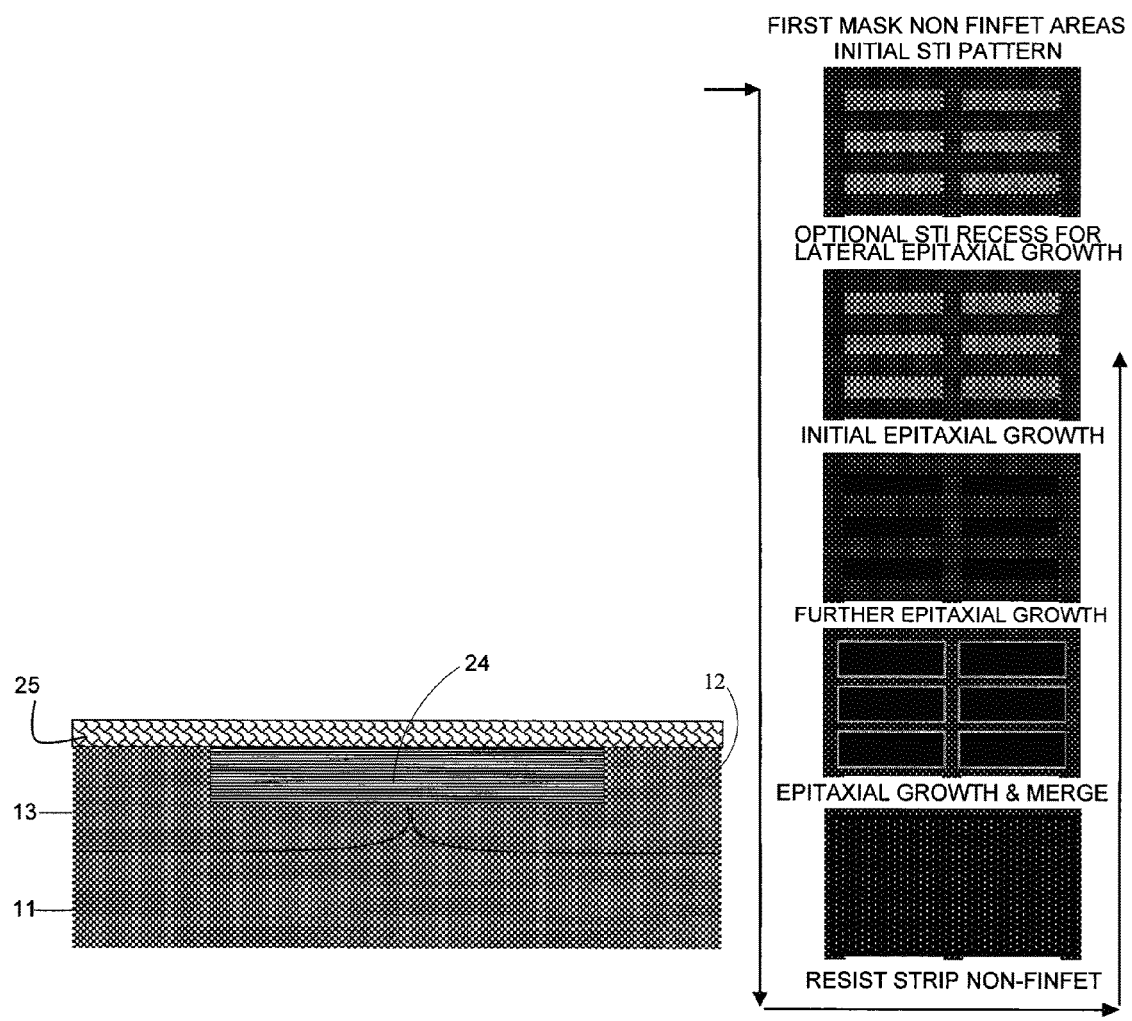
FIGS. 14-15 are cross-sectional views of the EPI growth.
Figure 15:
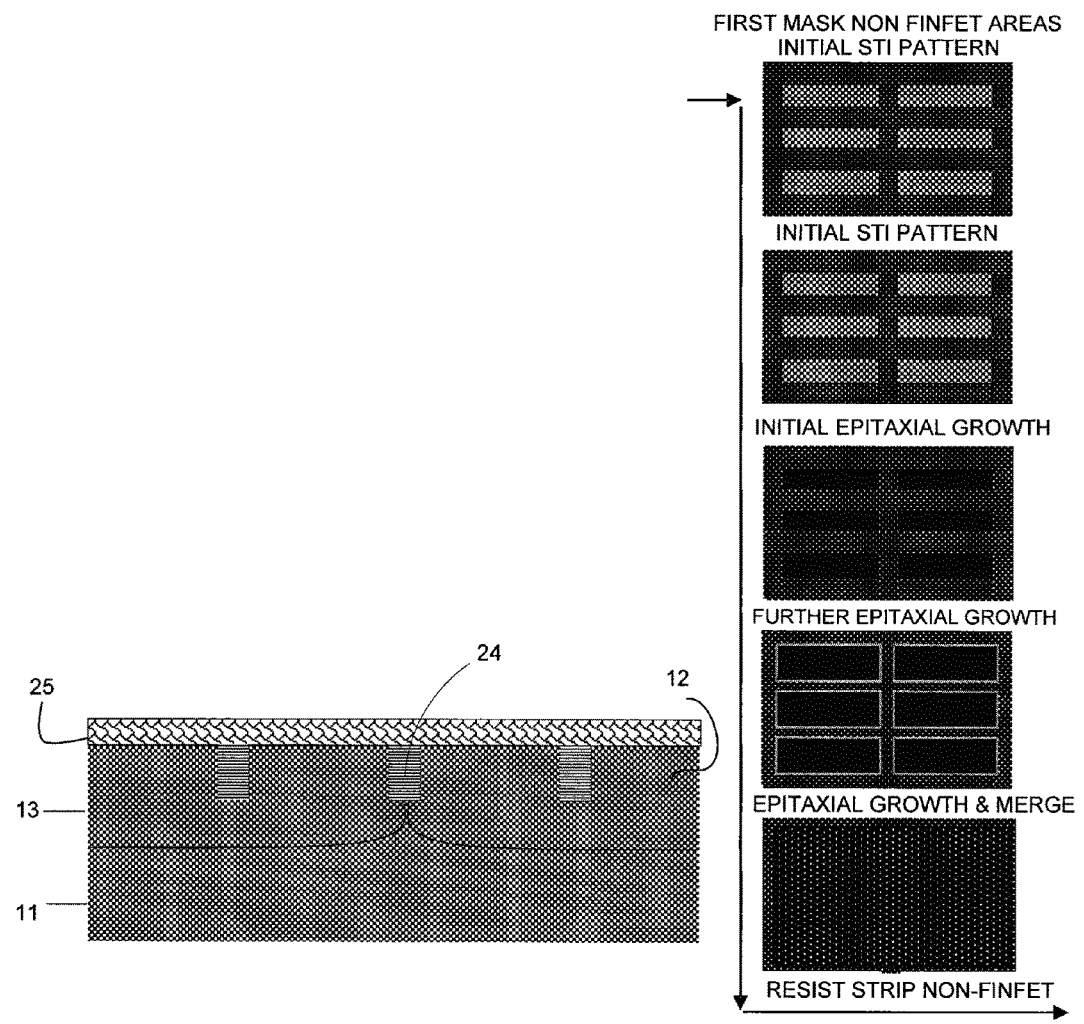

Referring to FIGS. 14 and 15, as seen along lines 2c and 2d, respectively, an EPI layer 25 is grown and planarized, and merged, e.g., in the sequence depicted at the right side of the figures. As will be readily appreciated by one of ordinary skill in the art, growing an EPI layer at is but one example of this stage of the fabrication process. Other types of semiconductor materials commonly used in the fabrication of circuits can also be used, including other silicon-based films laterally overgrown as depicted here, as well as gallium arsenide (GaAs), diamond-based or carbon nanotube films (e.g., using deposition).

Figure 16:
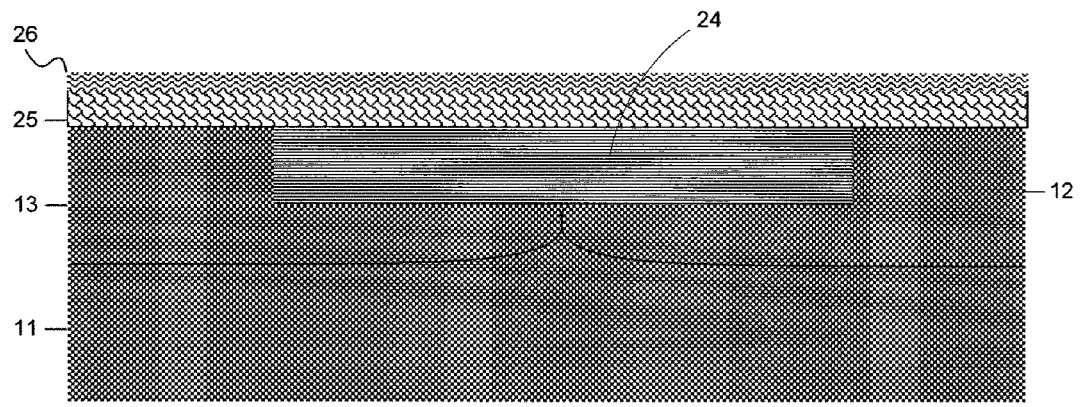
FIGS. 16-17 are cross-sectional views of the EPI hard mask deposition.
Figure 17:
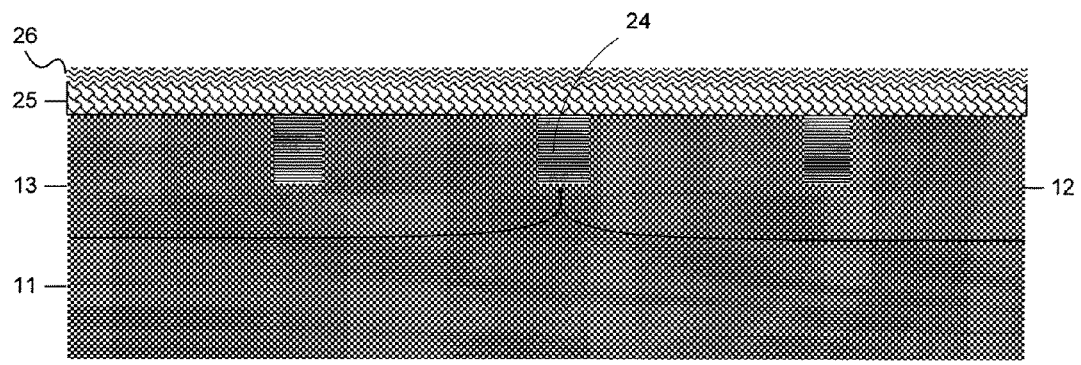

Referring to FIGS. 16-17, as seen along lines 2c and 2d, respectively, a hard mask 26 is deposited over the EPI layer 25.

Figure 18:
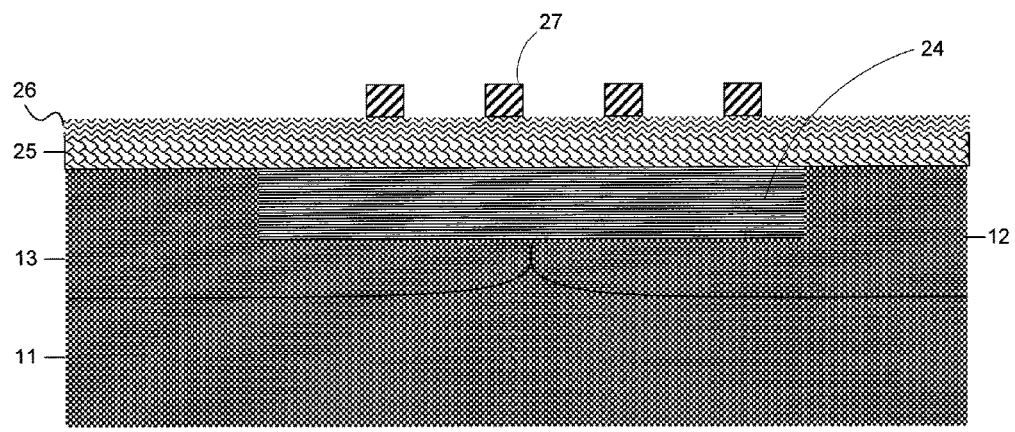
FIGS. 18-19 are cross-sectional views of the fabrication of the EPI Fin mandrels.
Figure 19:
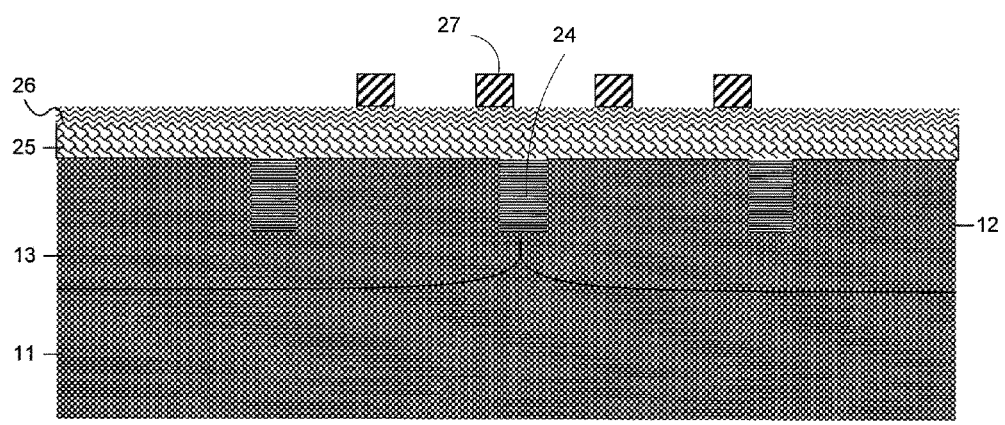

Referring to FIGS. 18-19, as seen along lines 2c-2d, respectively, Fin mandrel resist 27 is deposited over the EPI layer 26.

Figure 20:
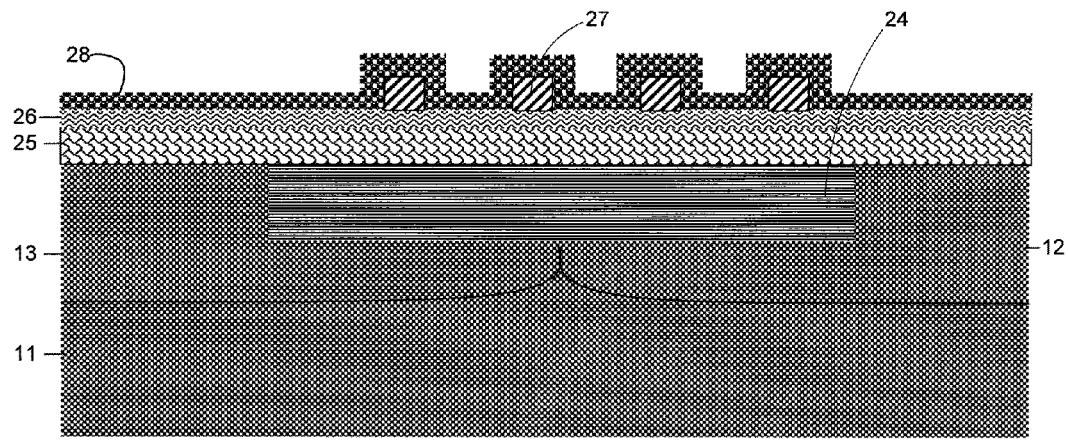
FIGS. 20 and 21 are cross-sectional views of the fabrication of the mandrel spacers.
Figure 21:
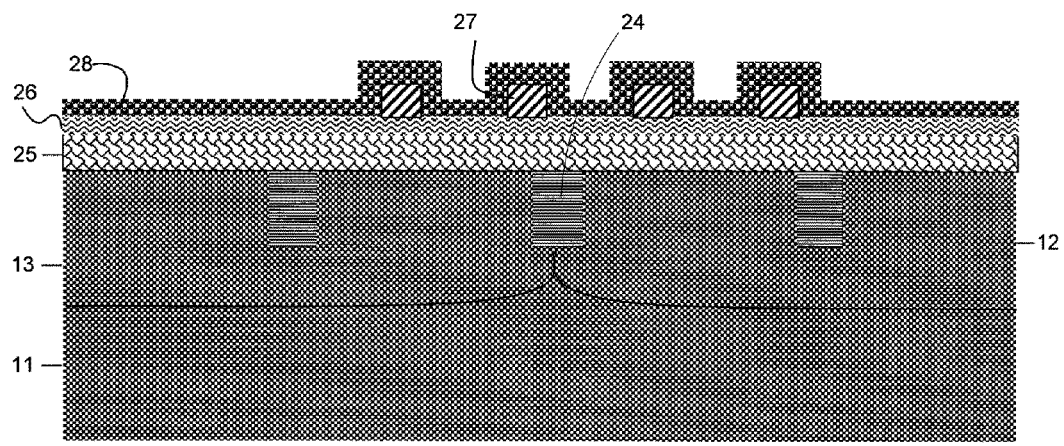

Referring to FIGS. 20-21, as seen along lines 2c-2d, respectively, material 28 to form the mandrel spacers is deposited.

Figure 22:
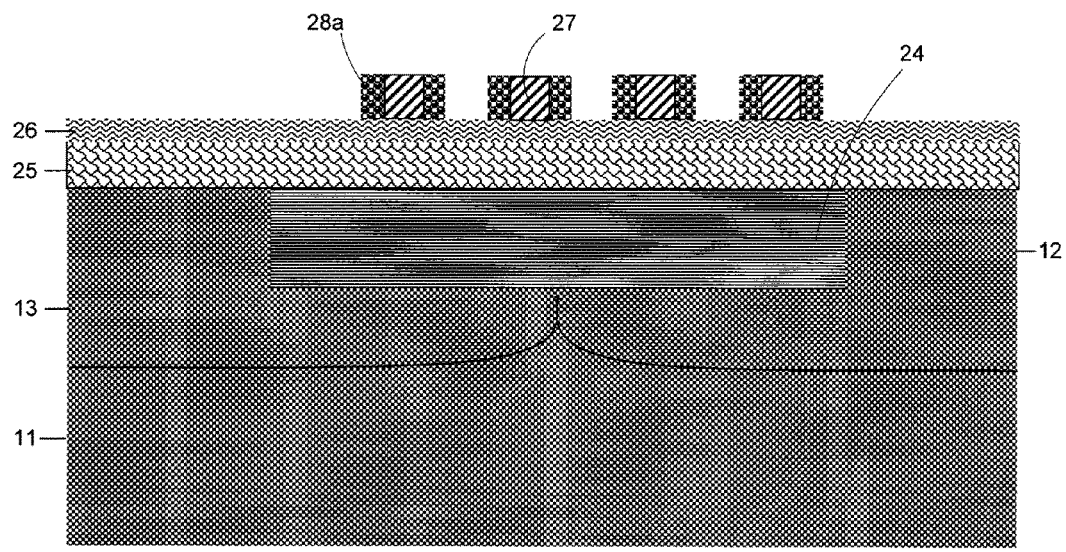
FIGS. 22-23 are cross-sectional views of the etching of the spacers.
Figure 23:
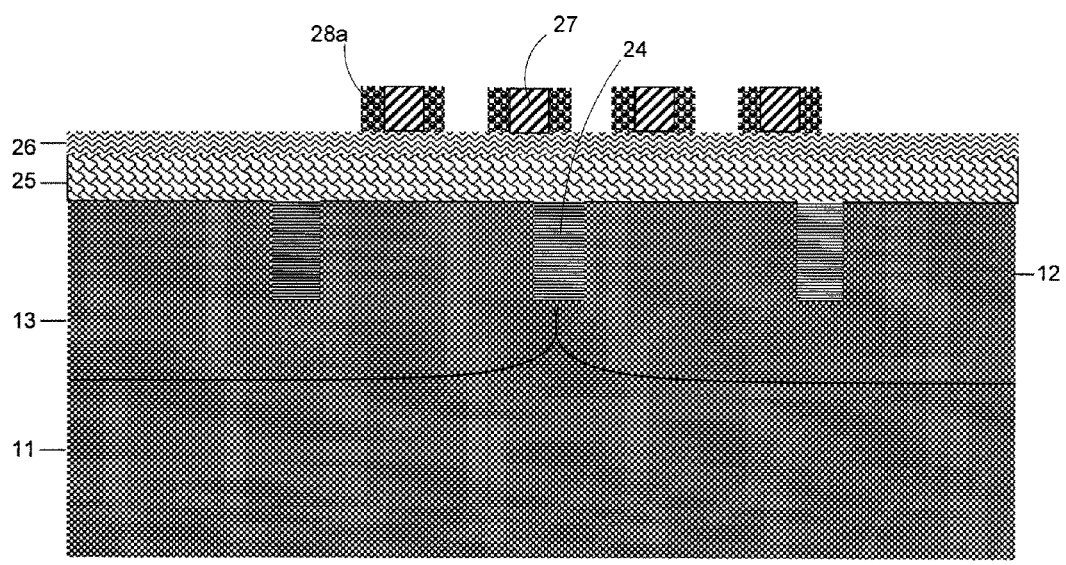

Referring to FIGS. 22-23, as seen along lines 2c-2d, respectively, etching leaves what will ultimately serve as spacers 28a.

Figure 24:
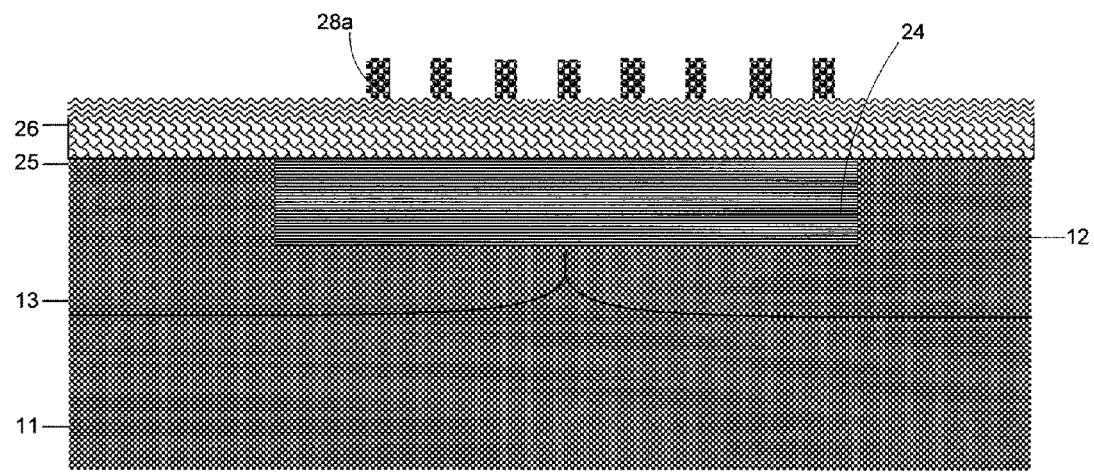
FIGS. 24-25 are cross-sectional views of the removal of the mandrels.
Figure 25:
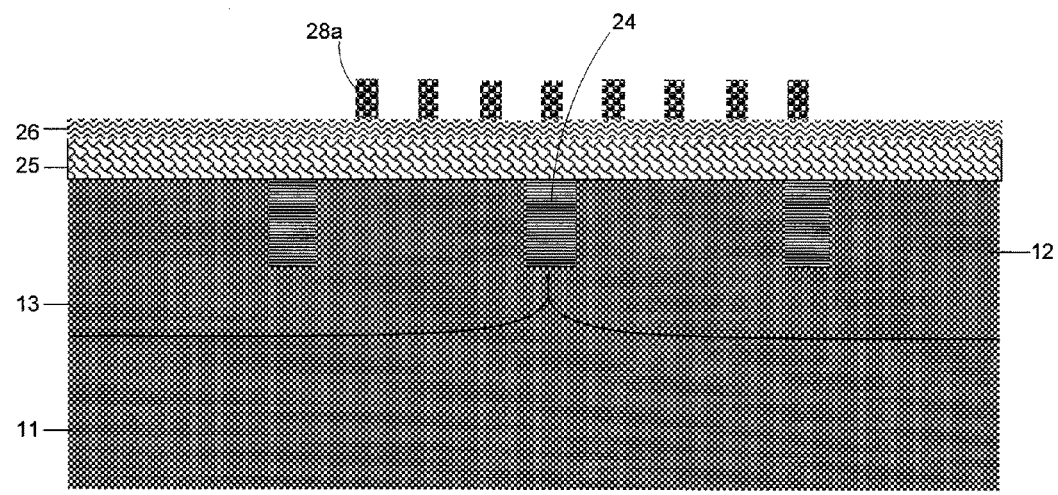

Referring to FIGS. 24-25, as seen along lines 2c-2d, respectively, the mandrels 27 are removed.

Figure 26:
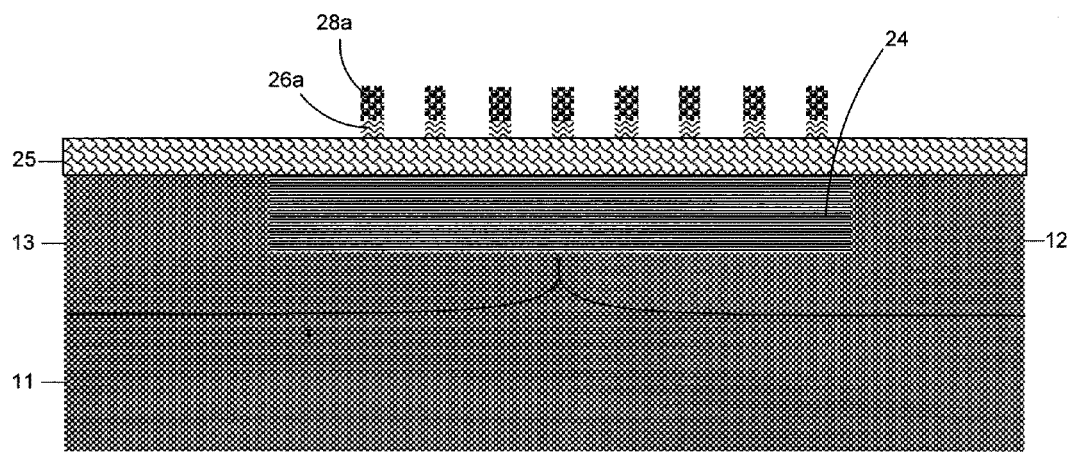
FIGS. 26-27 are cross-sectional views of the Fin hard mask etching.
Figure 27:
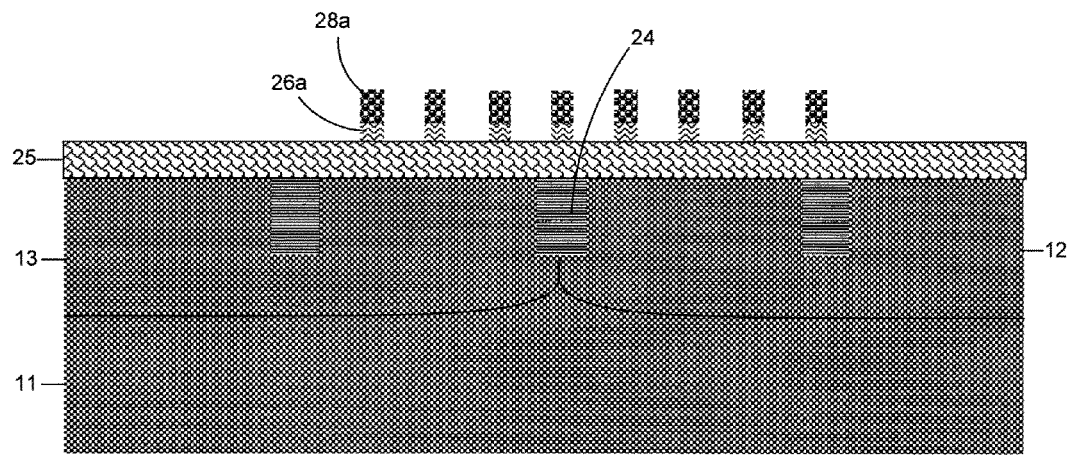

Referring to FIGS. 26-27, as seen along lines 2c-2d, respectively, the hard mask 26 is etched, thereby leaving hard mask regions 26a below the spacers 28a.

Figure 28:
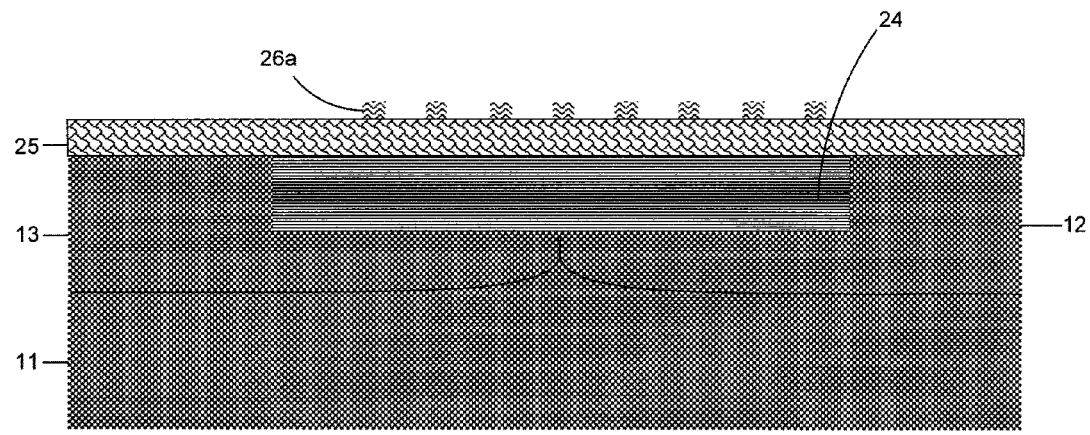
FIGS. 28-29 are cross-sectional views of the removal of the spacers.
Figure 29:
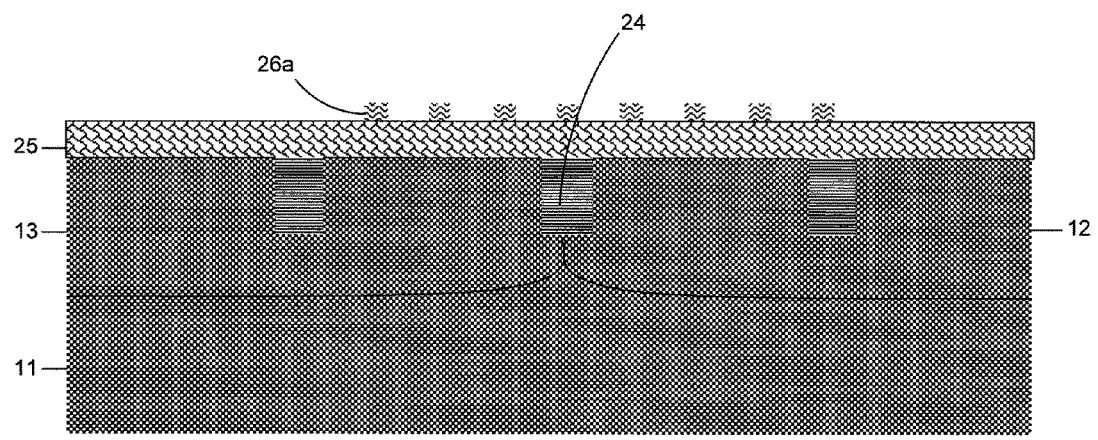

Referring to FIGS. 28-29, as seen along lines 2c-2d, respectively, the spacers 28a are removed.

Figure 30:
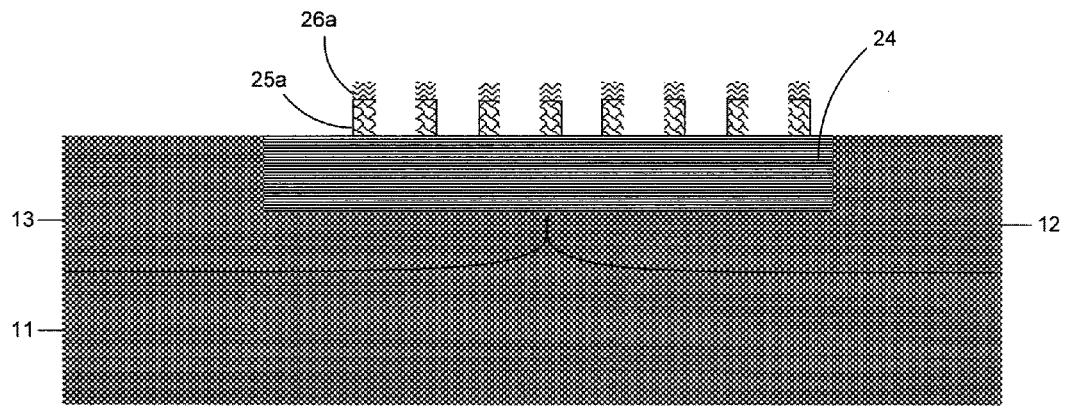
FIGS. 30-31 are cross-sectional views of the Fin etching.
Figure 31:
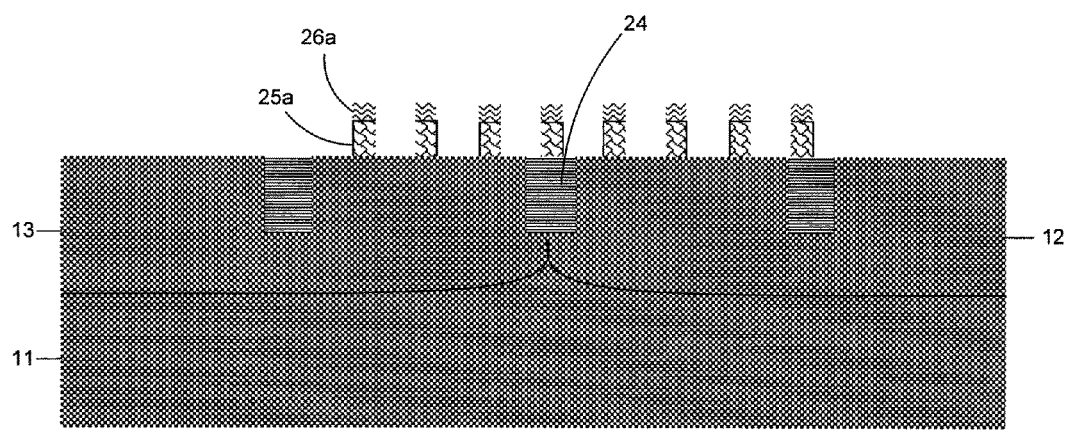

Referring to FIGS. 30-31, as seen along lines 2c-2d, respectively, the Fins are formed by etching the EPI layer 25, thereby leaving portions 25a of the EPI layer beneath the hard mask portions 26a.

Figure 32:
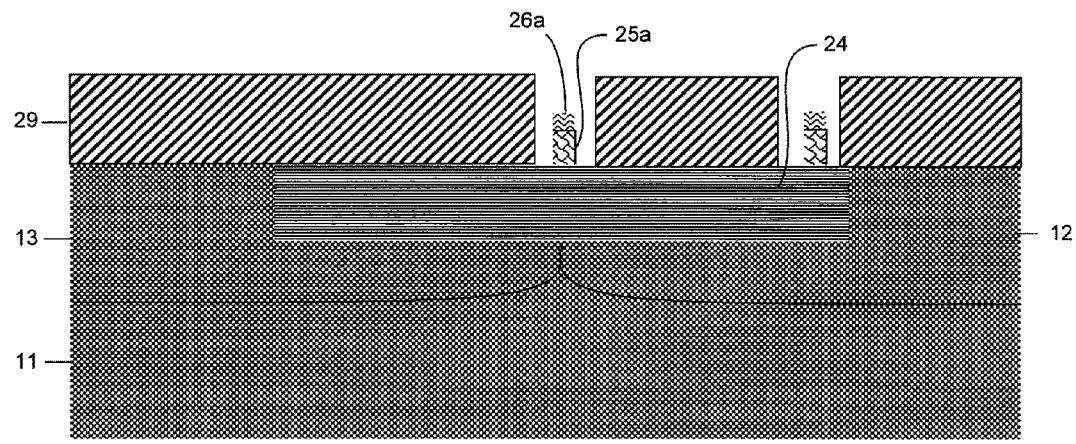
FIGS. 32-33 are cross-sectional views of the isolation of undesired Fins for removal.
Figure 33:
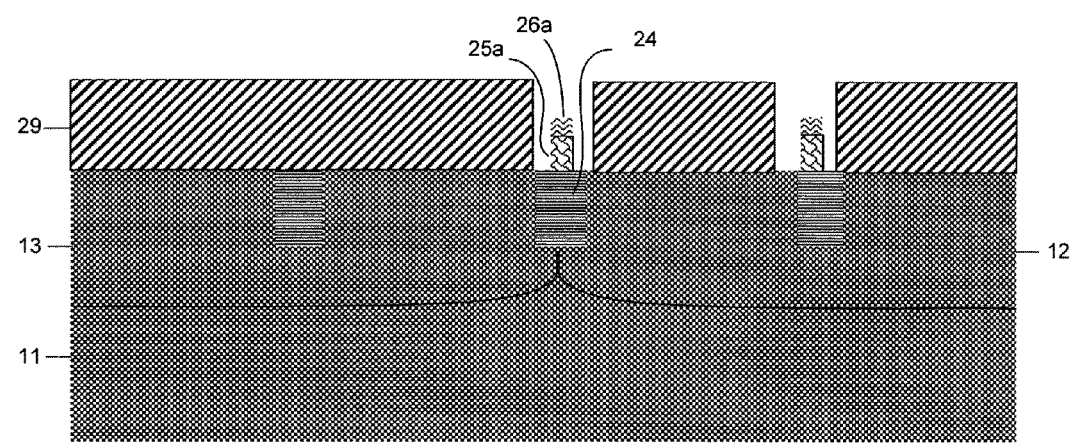

Referring to FIGS. 32-33, as seen along lines 2c-2d, respectively, masking material 29 is applied to protect the desired Fins while exposing the undesired Fins for removal.

Figure 34:
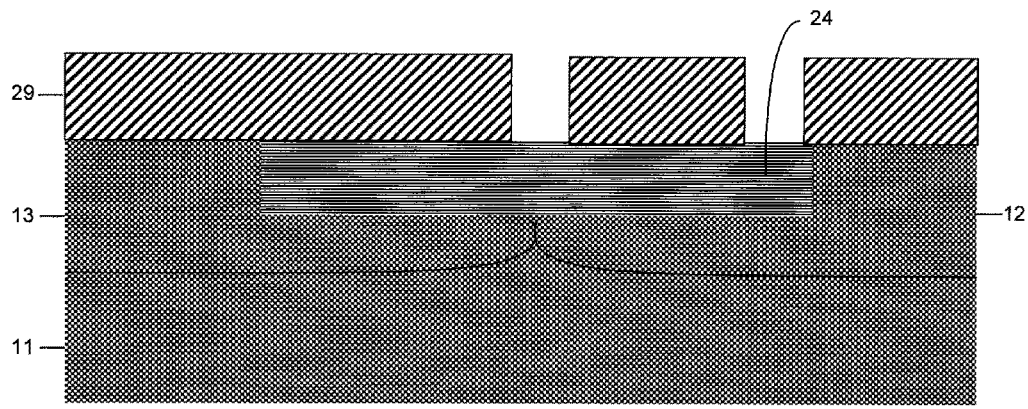
FIGS. 34-35 are cross-sectional views of the removal of the undesired Fins.
Figure 35:
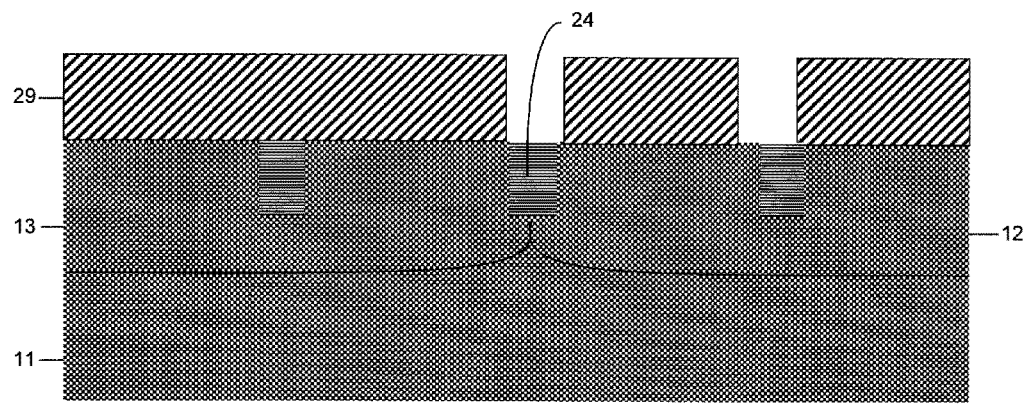

Referring to FIGS. 34-35, as seen along lines 2c-2d, respectively, the undesired Fins are removed.

Figure 36:
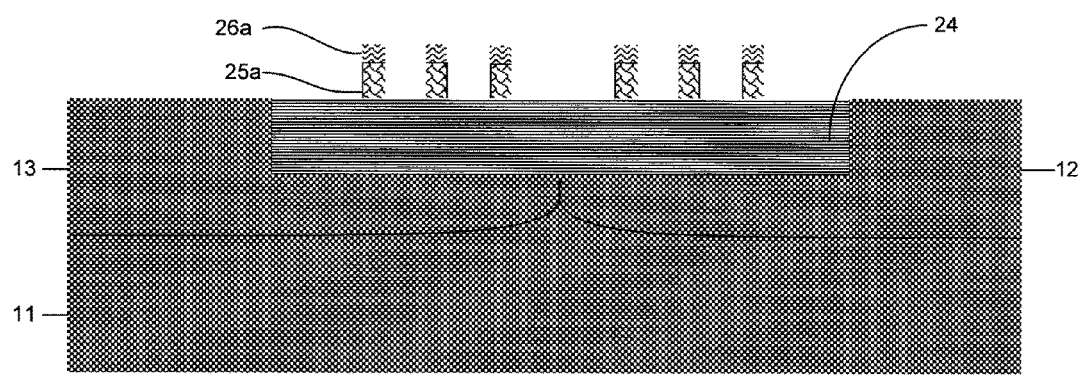
FIGS. 36-37 are cross-sectional views of the removal of the resist used for isolating undesired Fins.
Figure 37:
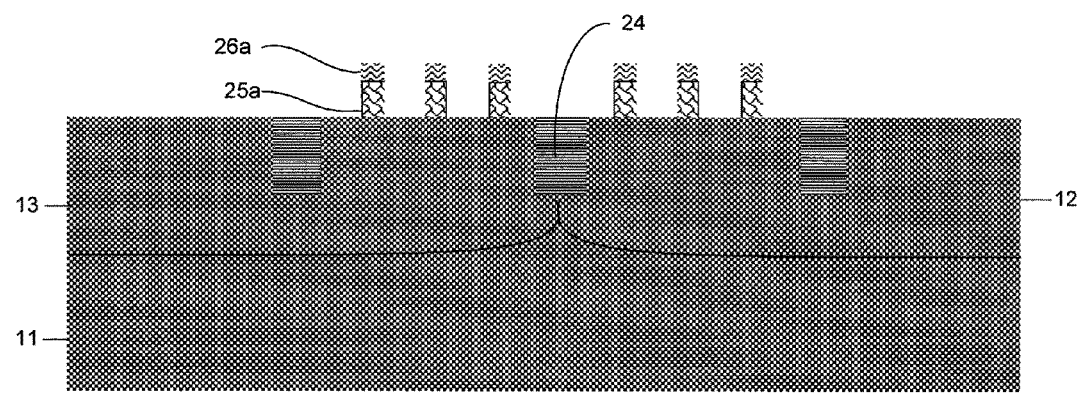

Referring to FIGS. 36-37, as seen along lines 2c-2d, respectively, the masking material 29 is removed, thereby exposing the desired Fins.

Figure 38:
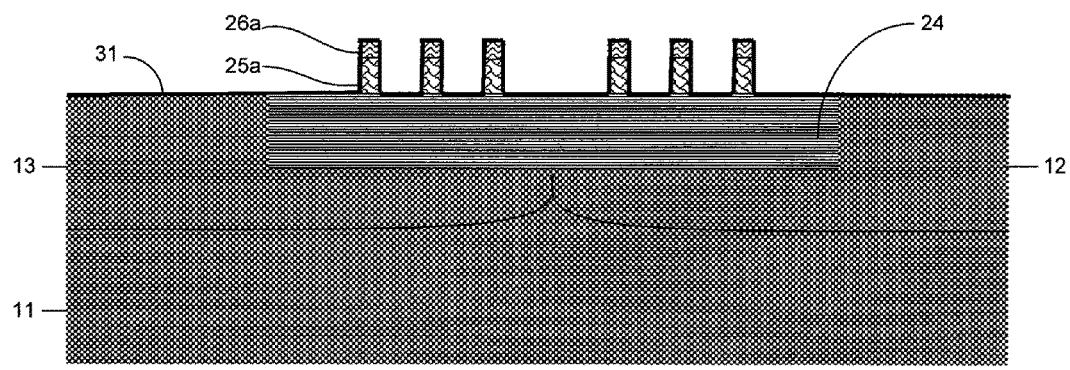
FIGS. 38-39 are cross-sectional views of the high K gate material deposition.
Figure 39:
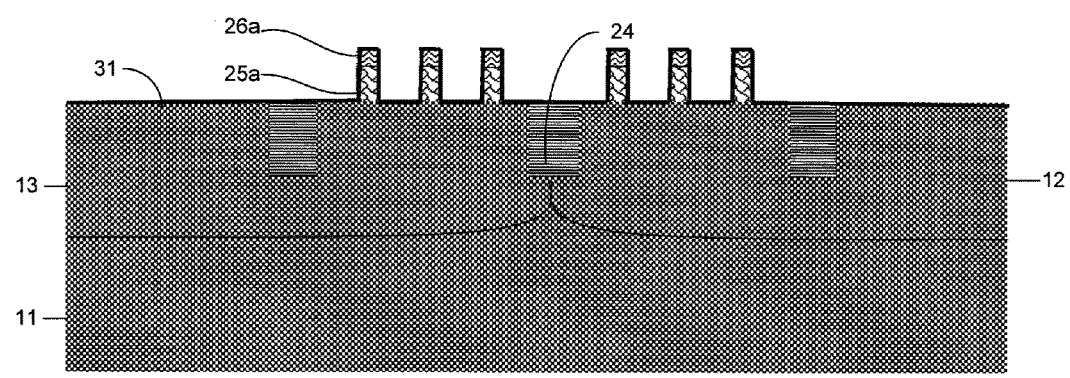

Referring to FIGS. 38-39, as seen along lines 2c-2d, respectively, high K gate material 31 is deposited.

Figure 40:
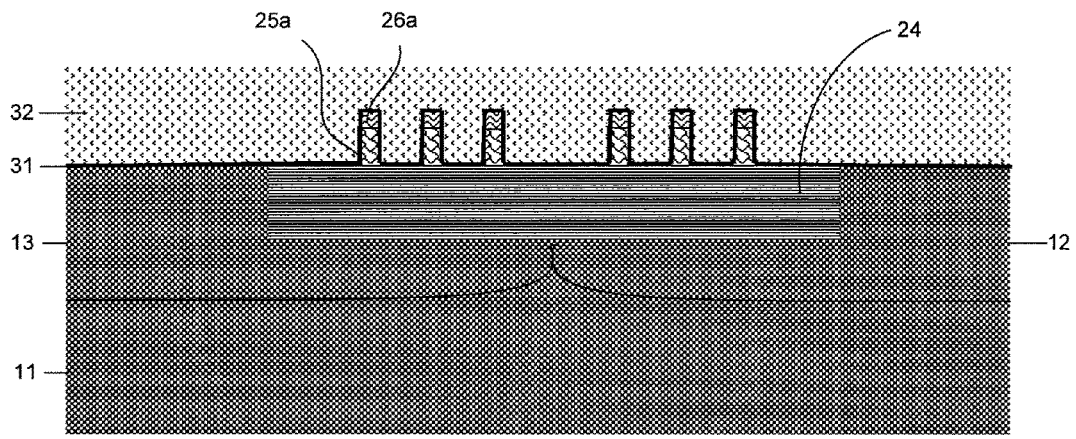
FIGS. 40-41 are cross-sectional views of the metal gate deposition.
Figure 41:
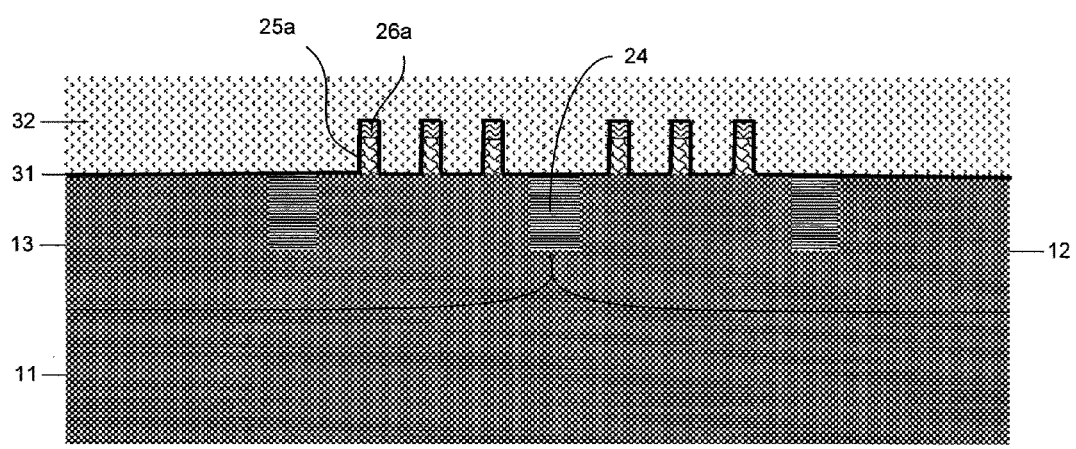

Referring to FIGS. 40-41, as seen along lines 2c-2d, respectively, metalization 32 for the gate electrodes is deposited. As will be readily appreciated by one of ordinary skill in the art, the exemplary fabrication process as described thus far is a single gate metalization scheme. As will be further appreciated, more complex processes can be used in accordance with well known techniques, e.g., fabricating a more complex gate using one metal for P-channel devices and another metal for N-channel devices. Additionally, the gates can be fabricated with a gate first or replacement gate flow as is well known in the art.

Figure 42:
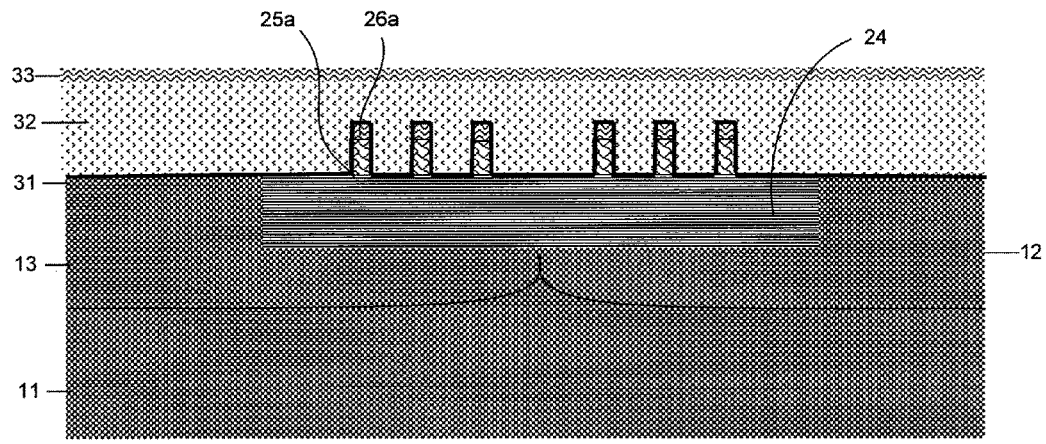
FIGS. 42-43 are cross-sectional views of the metal gate hard mask.
Figure 43:
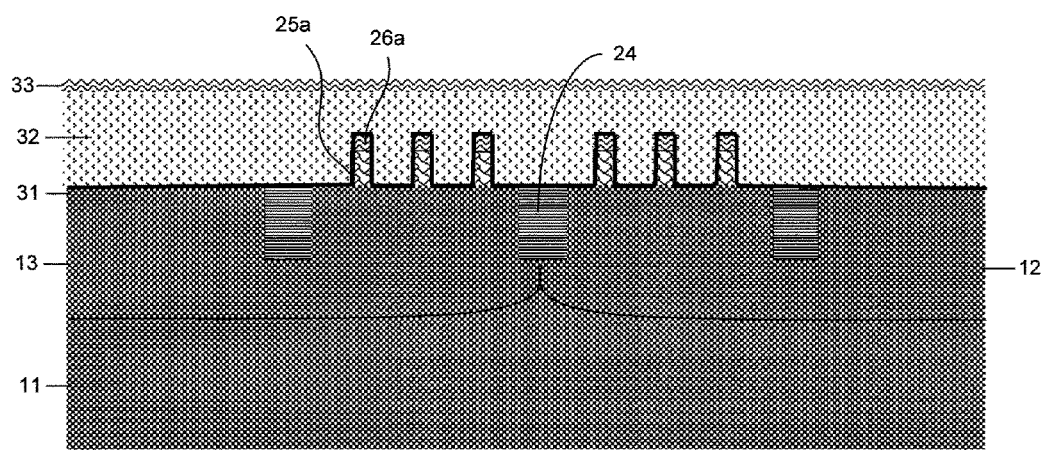

Referring to FIGS. 42-43, as seen along lines 2c-2d, respectively, a hard mask 33 is deposited.

Figure 44:
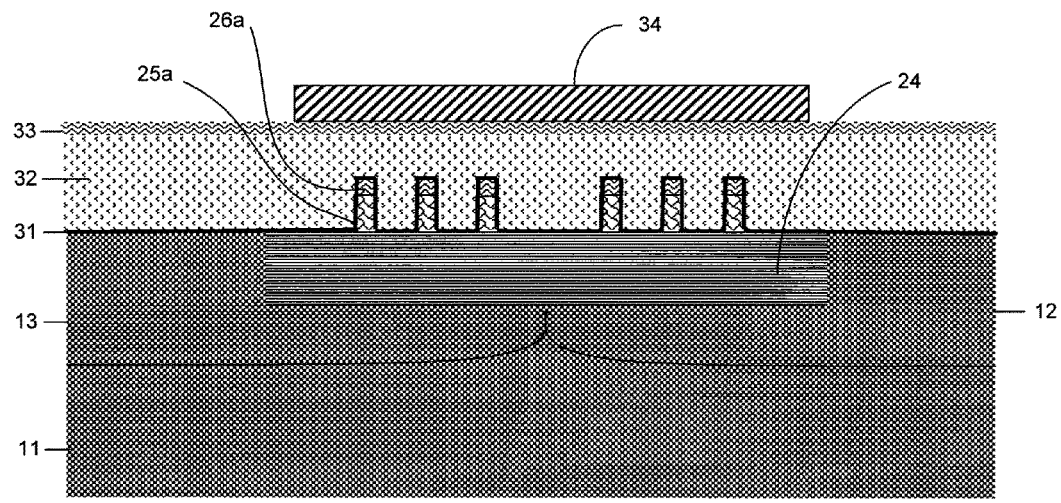
FIGS. 44-45 are cross-sectional views of the deposition of metal gate resist.
Figure 45:
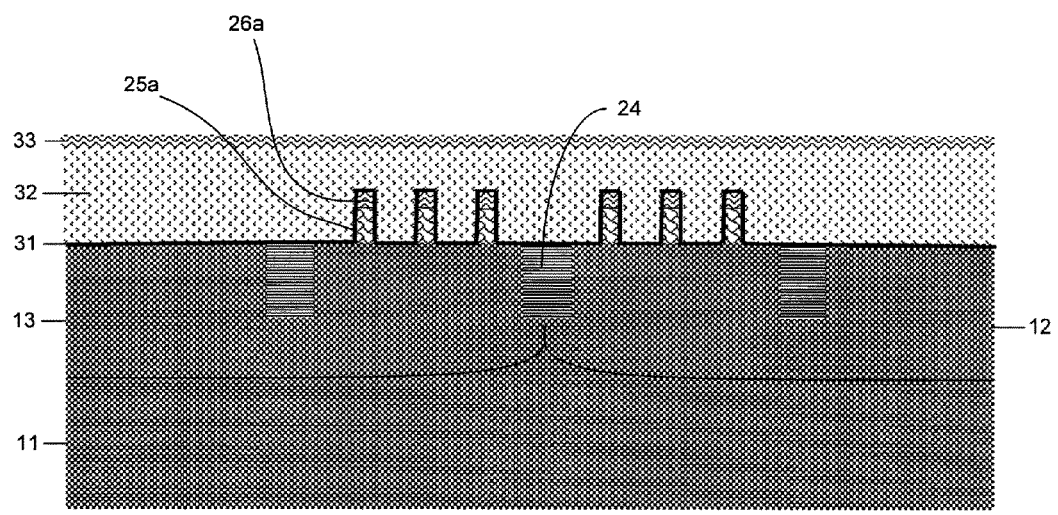

Referring to FIGS. 44-45, as seen along lines 2c-2d, respectively, masking material 34 is selectively applied over the metalization 33.

Figure 46:
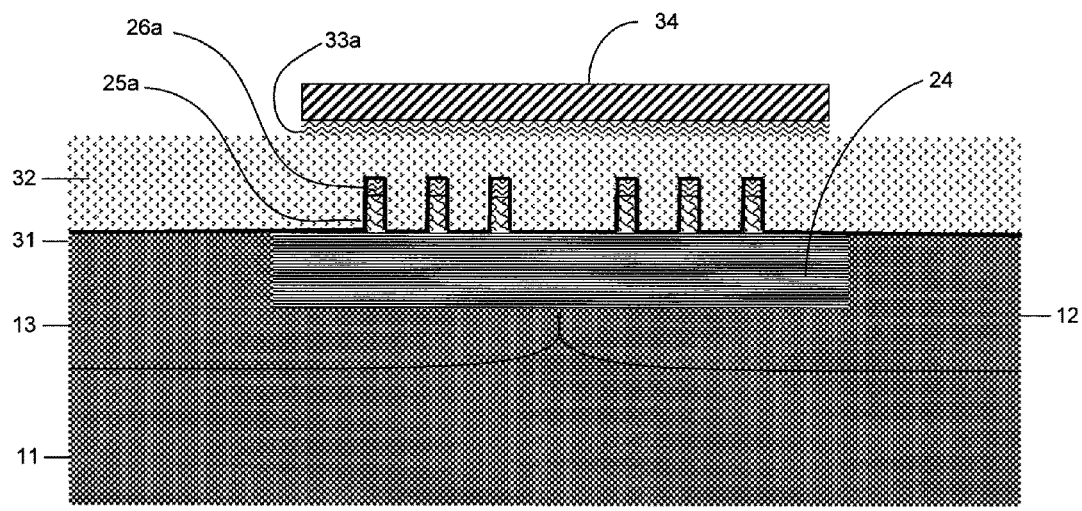
FIGS. 46-47 are cross-sectional views of the hard mask etch.
Figure 47:
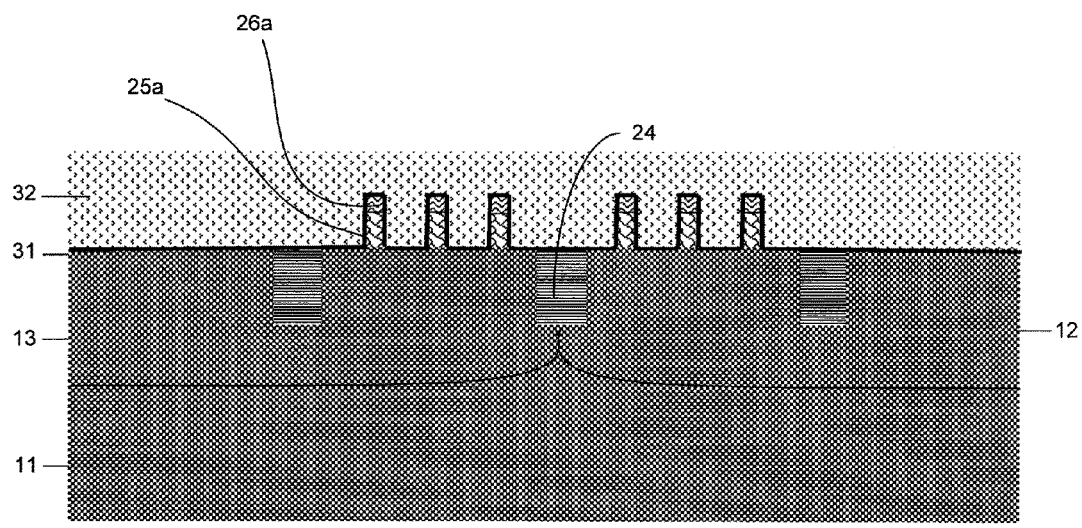

Referring to FIGS. 46-47, as seen along lines 2c-2d, respectively, the hard mask 33 is etched, thereby leaving only a selected portion 33a.

Figure 48:
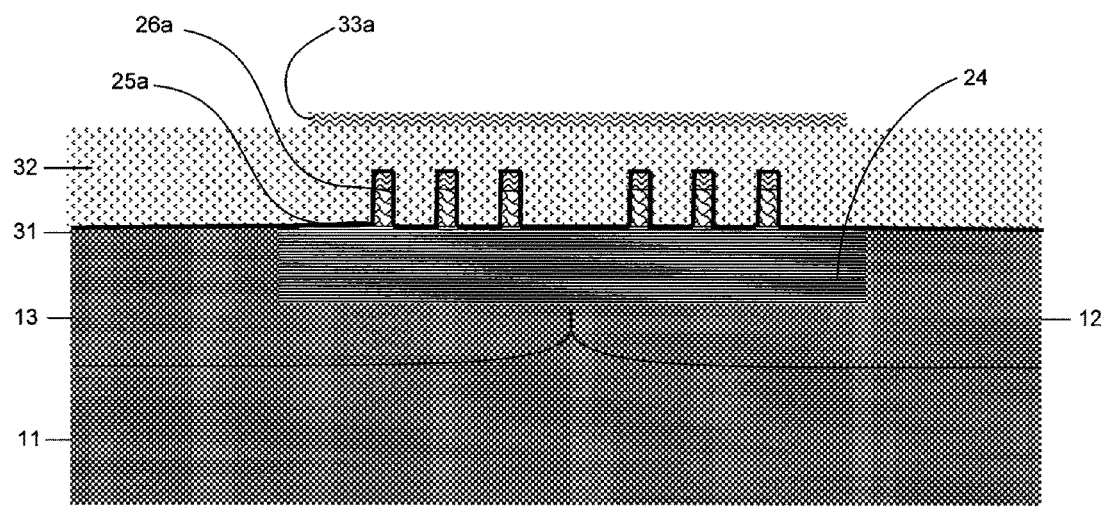
FIG. 48 is a cross-sectional view of the resist removal.

Referring to FIG. 48, the masking material 34 is removed.

Figure 49:
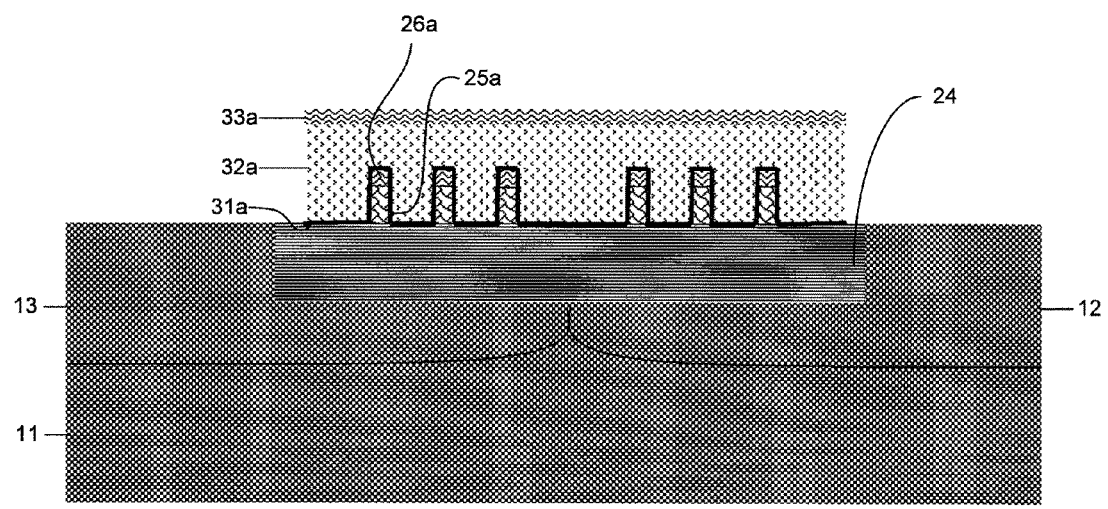
FIGS. 49-51 are cross-sectional views of the metal gate and high K gate etching.
Figure 50:
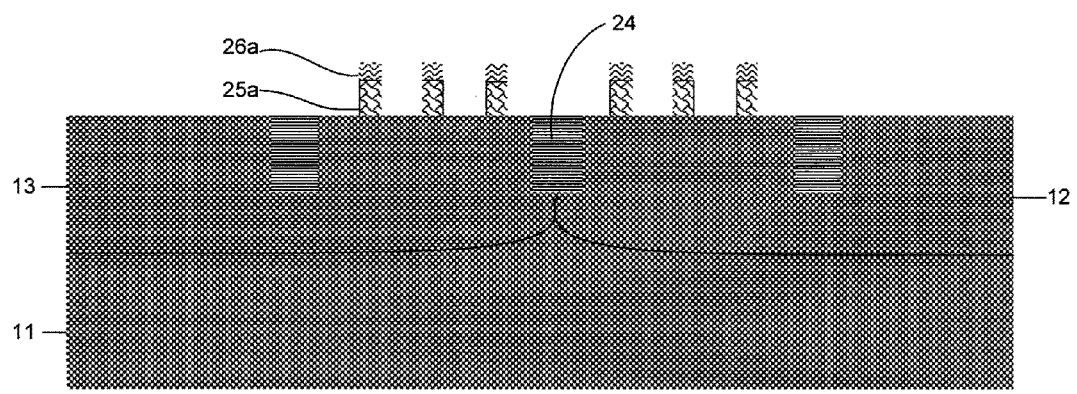
Figure 51:
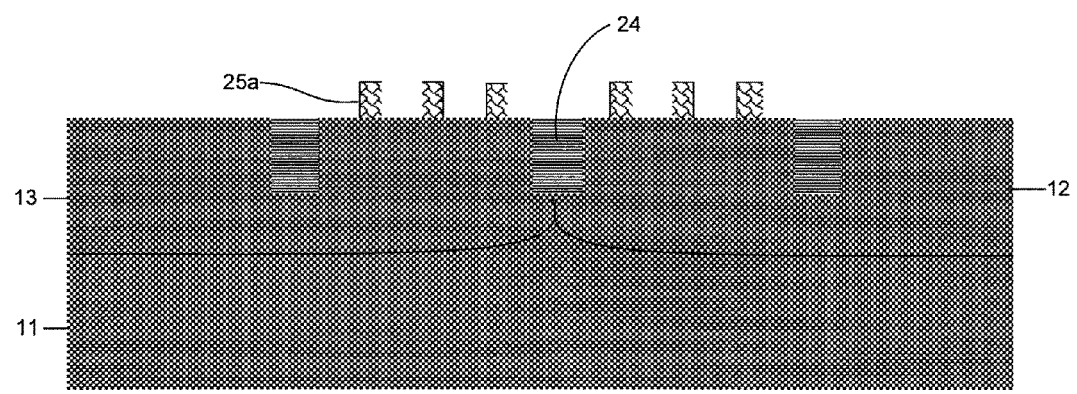

Referring to FIGS. 49-51, the gate metalization 32 and high K gate material 31 is etched, thereby leaving selected portions 32a, 31a.

Figure 52:
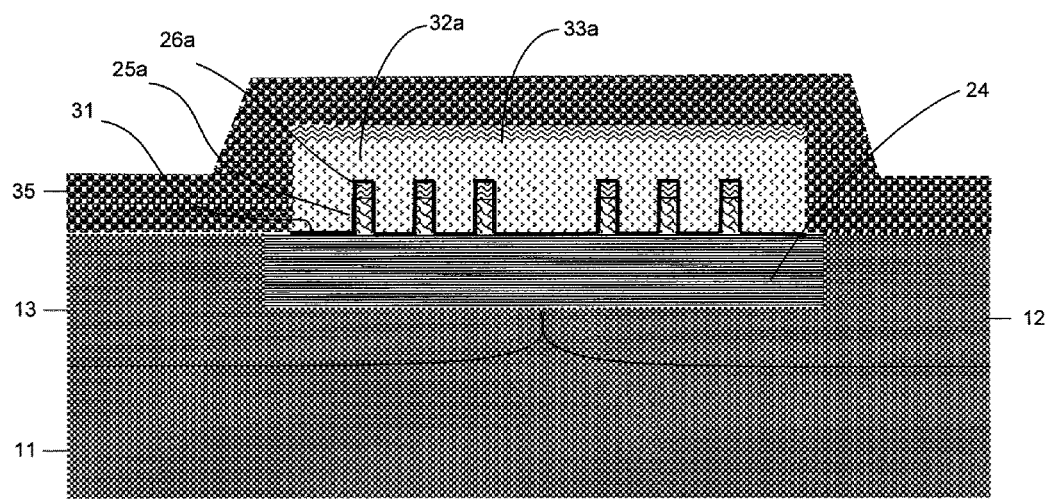
FIGS. 52-53 are cross-sectional views of the spacer deposition and etching.
Figure 53:
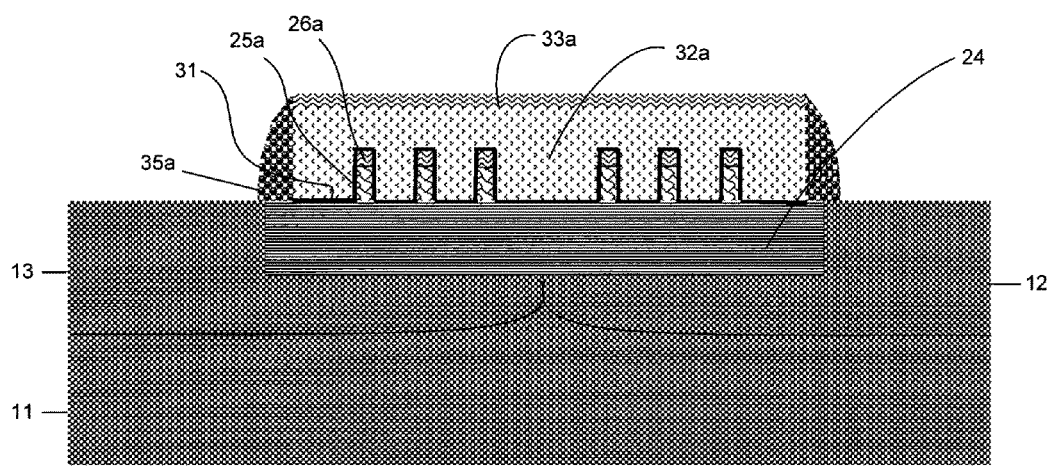

Referring to FIGS. 52-53, as seen along line 2c, spacer material 35 is selectively deposited and then etched away, thereby leaving selected portions 35a.

Figure 54:
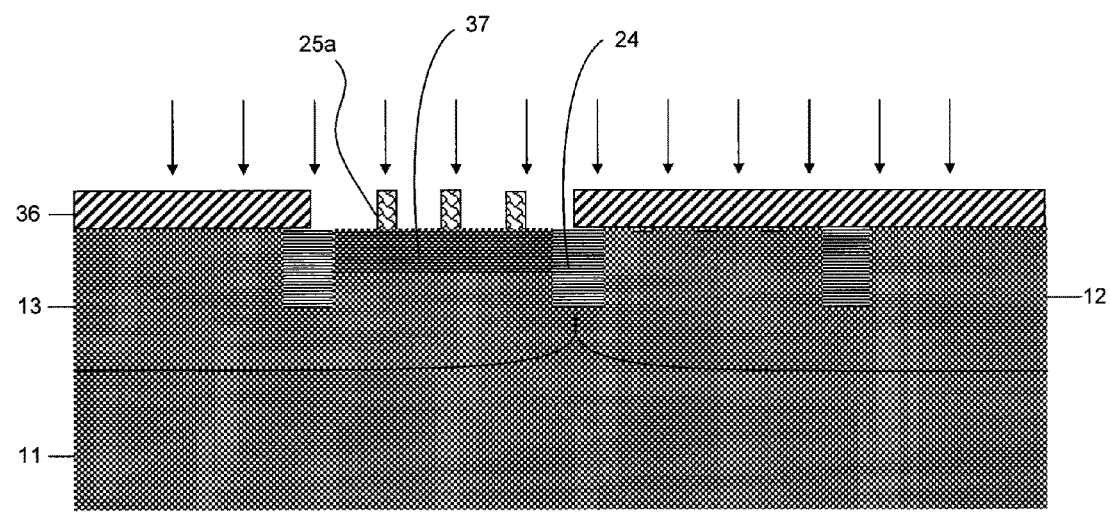
FIGS. 54-55 are cross-sectional views of the P-source/drain and N-source/drain implants.
Figure 55:
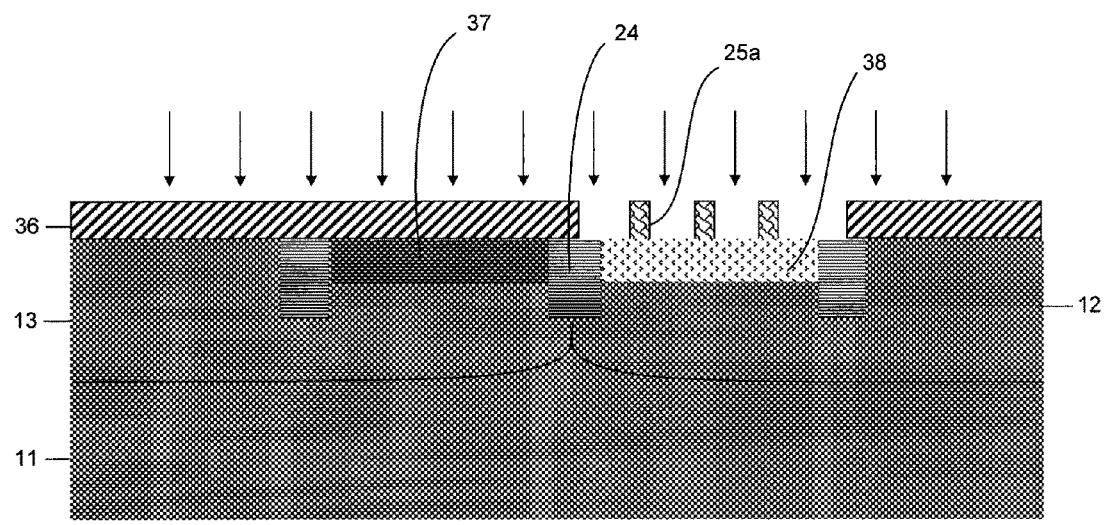

Referring to FIGS. 54-55, as seen along line 2d, masking material 36 is deposited and etched, following which the P-type source and drain regions 37 and N-type source and drain regions 38 are implanted.

Figure 56:
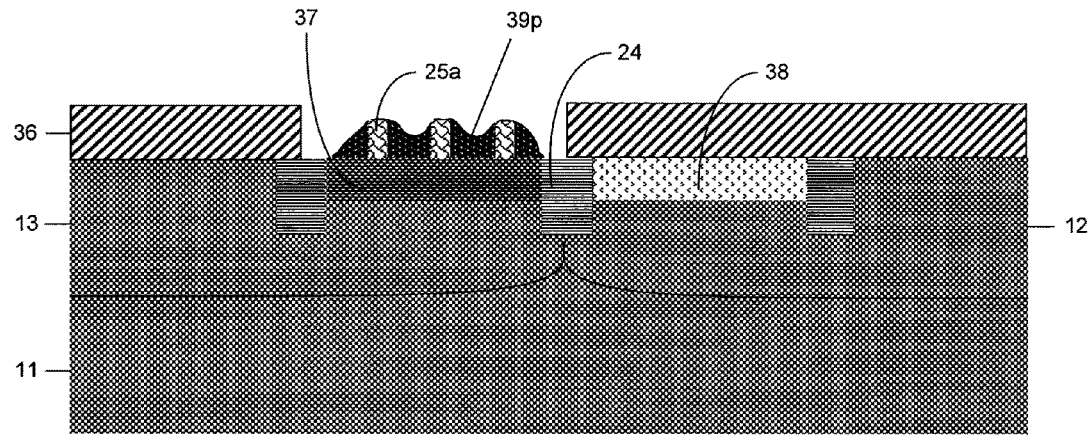
FIGS. 56-57 are cross-sectional views of the P-EPI and N-EPI merges.
Figure 57:
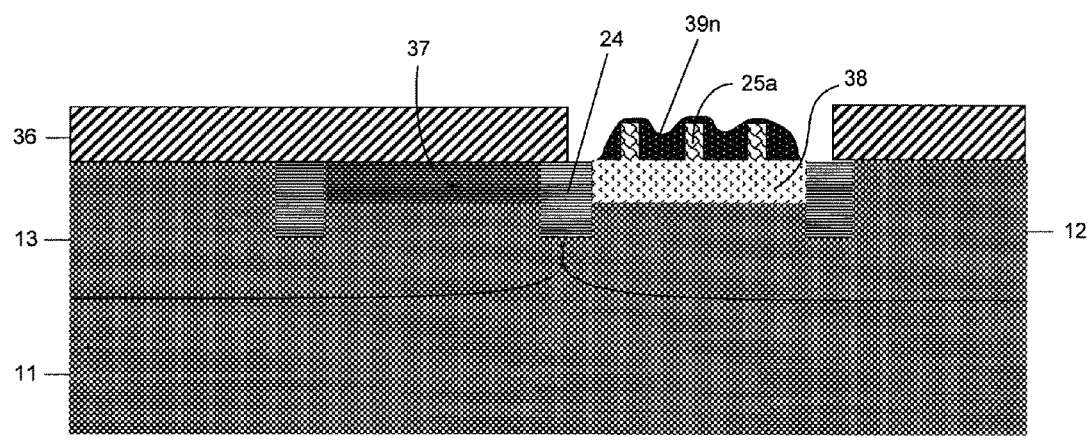

Referring to FIGS. 56-57, as seen along line 2*d*, P-EPI 39*p* and N-EPI 39*n* merges are applied.

Figure 58:
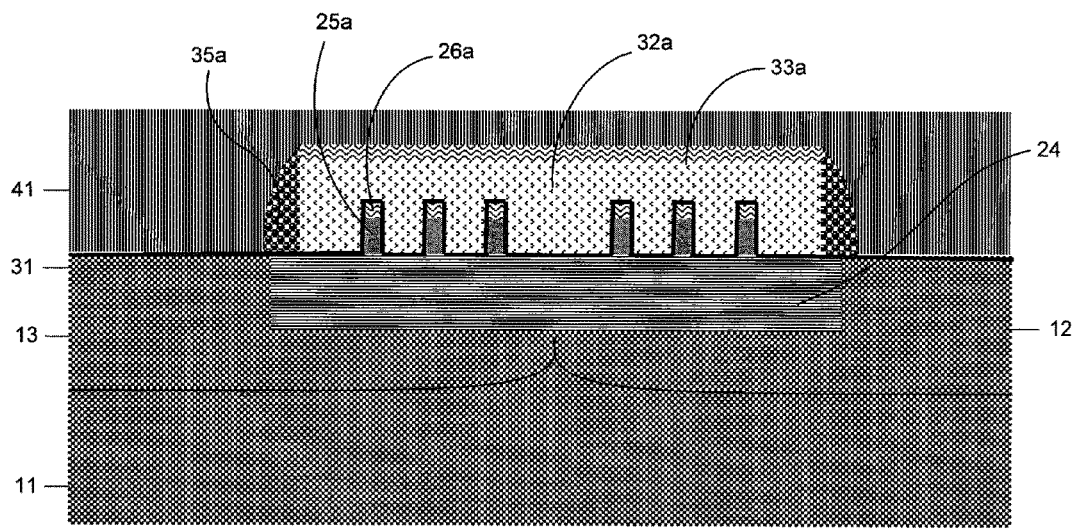
FIGS. 58-59 are cross-sectional views of the TEOS oxide deposition.
Figure 59:
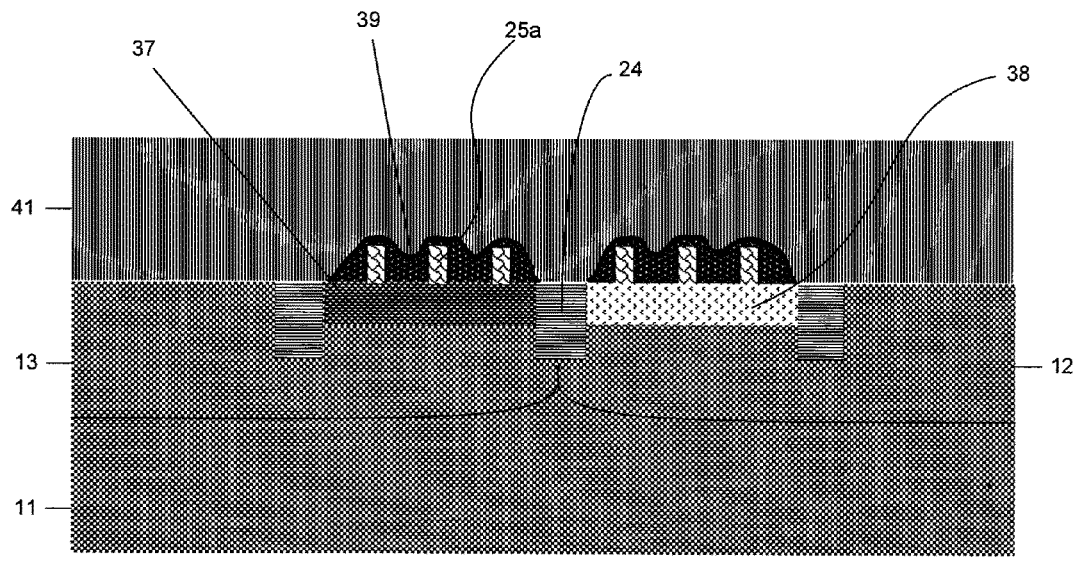

Referring to FIGS. 58-59, as seen along lines 2*c*-2*d*, respectively, TEOS 41 is applied.

Figure 60:
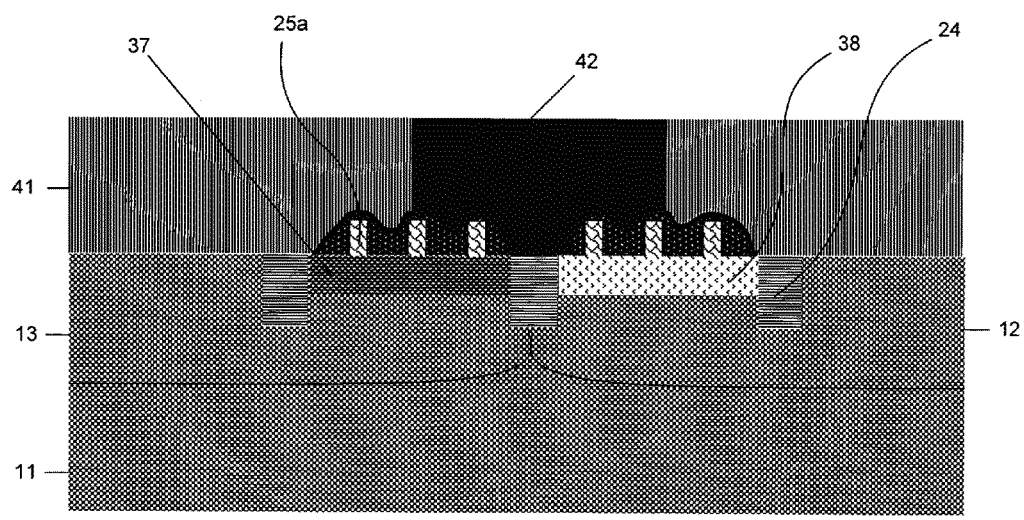
FIG. 60 is a cross-sectional view of the fabrication of the local interconnect.
Figures 61, 62:
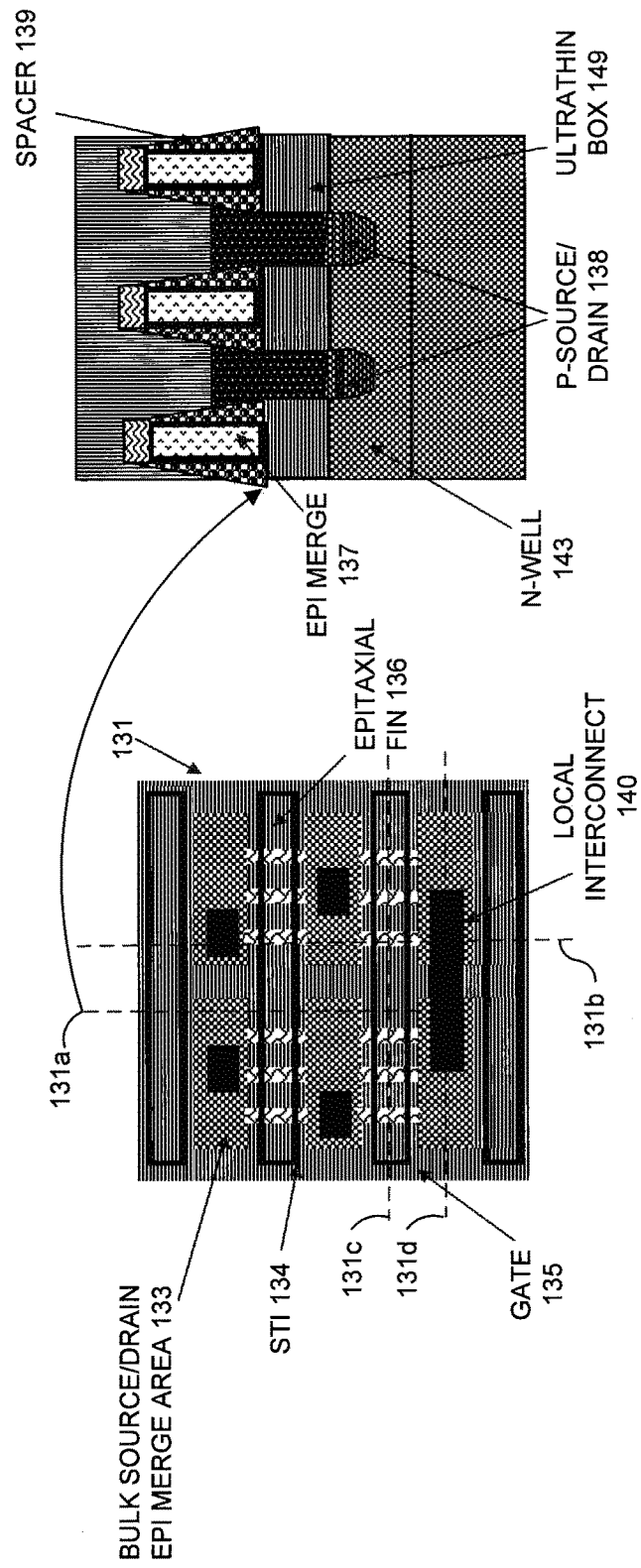
FIG. 61 is a plan view of a FinFET in accordance with an alternative exemplary embodiment.
FIGS. 62-65 are cross-sectional views of the device of FIG. 61 along lines 131a-131d, respectively.
Figures 63, 64, 65:
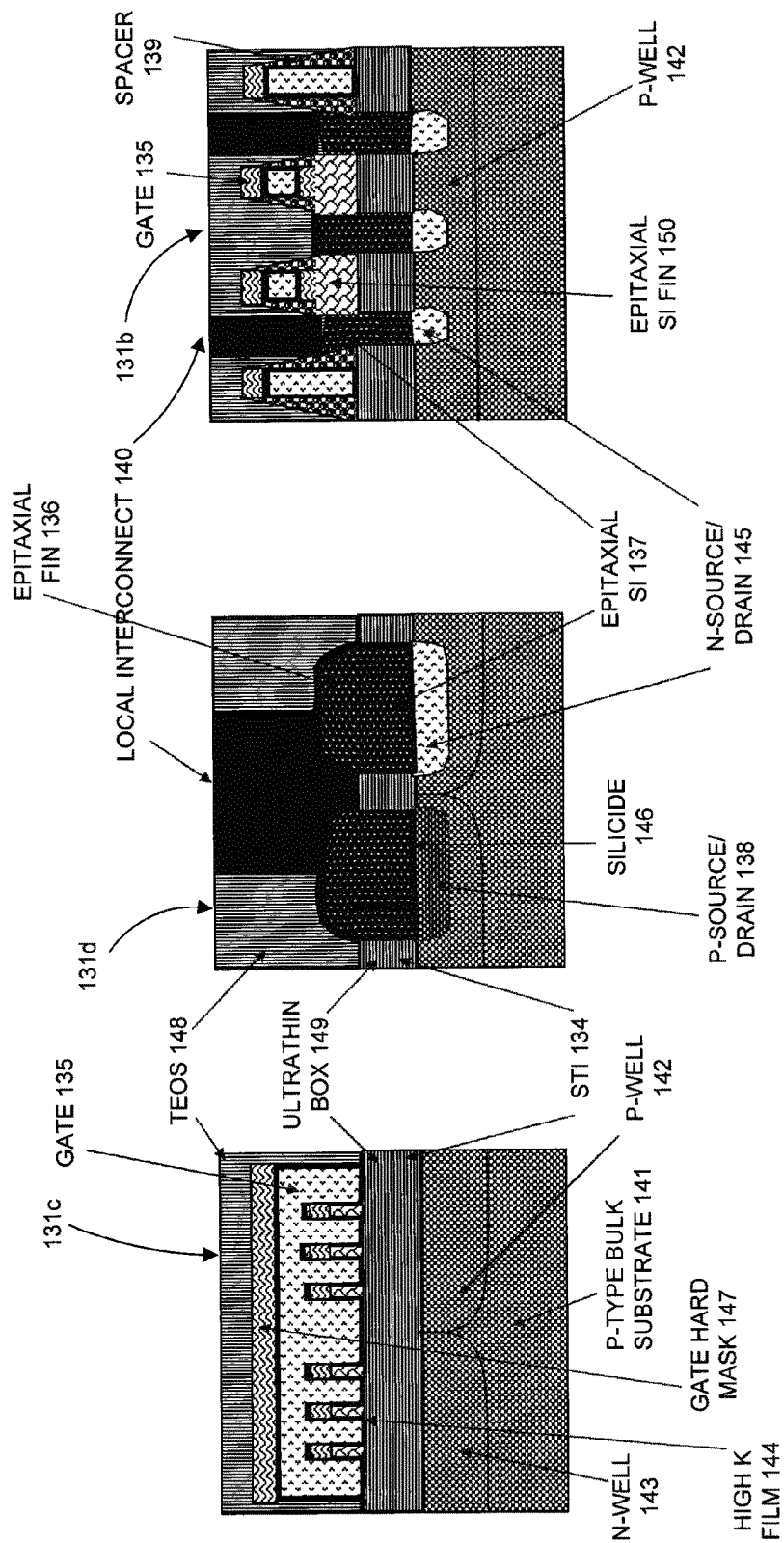
Figures 68, 69, 70:
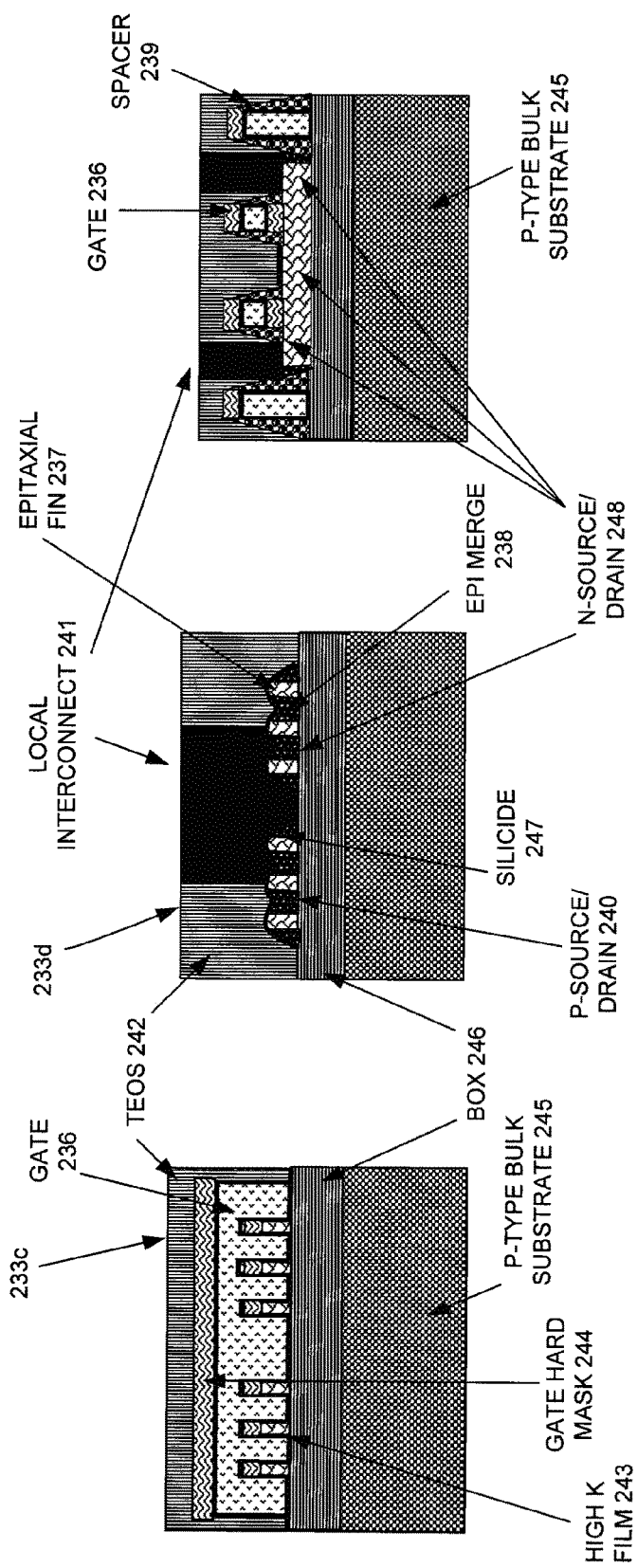

Referring to FIG. 60, as seen along line 2*d*, the TEOS oxide 41 is etched to allow formation of the local interconnect 42, e.g., by tungsten deposition, following which chemical and mechanical planarization (CMP) can be used to provides a planar surface.

Referring to FIGS. 61-65, a FinFET 131 in accordance with an alternative embodiment includes bulk source and drain regions and EPI merge areas 133, shallow trench isolation 134, gate electrodes 135, epitaxial Fins 136, EPI merges 137, P-type source and drain regions 138, spacers 139, local interconnects 140, P-type bulk substrate 141, P-well 142, N-well 143, high K film 144, N-type source and drain regions 145, silicide 146, gate hard mask 147, TEOS oxide 148, ultra thin boxes 149 and epitaxial silicon Fins 150, substantially as shown. The larger volume of the epitaxial material 137 used for the Fins advantageously allows for use of increased strain within the device channels.

Referring to FIGS. 66-70 a conventional FinFET 232 includes source and drain regions and EPI merge areas 234, shallow trench isolation 235, gate electrodes 236, epitaxial Fins 237, EPI merges 238, spacers 239, P-type source and drain regions 240, local interconnects 241, TEOS oxide 242, high K film 243, gate hard mask 244, silicide 247 and N-type source and drain regions 248 disposed substantially as shown over a box 246, which, in turn, is disposed over the P-type bulk substrate 245. The spacers 239 protect the gates 236 during diffusion of the source and drain regions, and also prevent strain material from getting too close to the gate 236. Further, the lower volume of EPI merges 7 to surround the Fins minimize potential strain effects.

Also, integrated circuit design systems (e.g., work stations with digital processors) are known that create integrated circuits based on executable instructions stored on a computer readable medium including memory such as but not limited to CDROM, RAM, other forms of ROM, hard drives, distributed memory, or any other suitable computer readable medium. The instructions may be represented by any suitable language such as but not limited to hardware descriptor language (HDL) or other suitable language. The computer readable medium contains the executable instructions that when executed by the integrated circuit design system causes the integrated circuit design system to produce an integrated circuit that includes the devices or circuitry as set forth above. The code is executed by one or more processing devices in a work station or system (not shown). As such, the devices or circuits described herein may also be produced as integrated circuits by such integrated circuit systems executing such instructions.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an integrated fin-based field effect transistor (FinFET), comprising:
    a bulk region;
    a plurality of substantially parallel shallow trench isolation (STI) regions disposed within first portions of said bulk region;
    a plurality of source and drain regions each of which is disposed between neighboring ones of said plurality of STI regions within second portions of said bulk region;
    a plurality of fin regions disposed substantially normal to said plurality of STI regions and each of which includes
        first portions disposed over a portion of said plurality of STI regions, and
        second portions disposed within a portion of said plurality of source and drain regions; and
    a plurality of gate regions each of which is disposed over a respective portion of said plurality of fin regions and a respective one of said plurality of STI regions and laterally away from neighboring ones of said plurality of source and drain regions.

2. The apparatus of claim 1, wherein said plurality of fin regions comprises a plurality of portions of an epitaxial film.

3. The apparatus of claim 1, wherein said plurality of fin regions comprises a plurality of portions of a silicon-based film.

4. The apparatus of claim 1, wherein said plurality of fin regions comprises a plurality of portions of a gallium arsenide film.

5. The apparatus of claim 1, wherein said plurality of fin regions comprises a plurality of portions of a diamond-based film.

6. The apparatus of claim 1, wherein said plurality of fin regions comprises a plurality of portions of a carbon nanotube film.

* * * * *